US012235315B2

(12) United States Patent
Ferrari

(10) Patent No.: US 12,235,315 B2
(45) Date of Patent: Feb. 25, 2025

(54) TEST SYSTEM SUPPORT COMPONENT EXCHANGE SYSTEM AND METHOD

(71) Applicant: Advantest Test Solutions, Inc., San Jose, CA (US)

(72) Inventor: Paul Ferrari, Mission Viejo, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 169 days.

(21) Appl. No.: 18/086,333

(22) Filed: Dec. 21, 2022

(65) Prior Publication Data

US 2023/0314499 A1 Oct. 5, 2023

Related U.S. Application Data

(60) Provisional application No. 63/326,158, filed on Mar. 31, 2022.

(51) Int. Cl.
  *G01R 31/28* (2006.01)

(52) U.S. Cl.
  CPC ..... *G01R 31/2863* (2013.01); *G01R 31/2865* (2013.01); *G01R 31/2875* (2013.01); *G01R 31/2879* (2013.01)

(58) Field of Classification Search
  CPC ............ G01R 31/2863; G01R 31/2865; G01R 31/2875; G01R 31/2879; G01R 31/2877
  See application file for complete search history.

(56) References Cited

U.S. PATENT DOCUMENTS

| 7,673,193 | B1 * | 3/2010 | Ong | G11C 29/56 |
| | | | | 714/719 |
| 2014/0091826 | A1 * | 4/2014 | Chui | G01R 1/07378 |
| | | | | 324/756.03 |
| 2014/0111242 | A1 * | 4/2014 | Xie | G01R 31/2853 |
| | | | | 324/762.02 |
| 2019/0108412 | A1 * | 4/2019 | Wang | H04N 23/62 |
| 2021/0396801 | A1 | 12/2021 | Ranganathan et al. | |
| 2022/0365132 | A1 * | 11/2022 | Song | G01R 31/2889 |

FOREIGN PATENT DOCUMENTS

JP 2005156172 A 6/2005

* cited by examiner

*Primary Examiner* — Alvaro E Fortich

(57) ABSTRACT

The presented systems and methods enable efficient and effective exchange of test support components. There are a variety of different test support components (e.g., active thermal interposer (ATI) device, exchange kit, etc.) that are configured to support various testing functions. In one embodiment, an automated test equipment (ATE) system comprises: a support component configured to enable support functions associated with testing of a device under test (DUT); a support component head configured to selectively couple with the support component; and an exchange socket configured to hold the support component for a portion of selectively coupling the support component and the support component head.

13 Claims, 26 Drawing Sheets

TEST SYSTEM SUPPORT COMPONENT EXCHANGE SYSTEM AND METHOD

RELATED APPLICATIONS

This application claims the benefit of and priority to provisional application 63/326,158, entitled A TEST SYSTEM SUPPORT COMPONENT EXCHANGE SYSTEM AND METHOD filed Mar. 31, 2022, which is incorporated herein by reference.

FIELD OF INVENTION

The presented systems and methods relate to the field of integrated circuit manufacturing and test. More specifically, presented systems and methods relate to testing support activities and components (e.g., active thermal interposer (ATI) devices, etc.).

BACKGROUND

It is common to subject integrated circuits, either packaged or unpackaged, to environmental testing as an operation in a manufacturing process. Typically, in such testing, the integrated circuit devices are subject to electrical testing (e.g., "test patterns," etc.) to confirm functionality. Traditionally, such testing has included placing one or more devices under test (DUT) into a test system. It is appreciated there can be various types of devices tested, including integrated circuits and so on. Different types of support functionality can be used during testing (e.g., temperature support, peripheral component support, etc.). Providing facilities that enable both testing and control of support functionality can be difficult.

Devices are often tested while being subjected to environmental stress. For example, an integrated circuit is heated and/or cooled to its specification limits while being electrically tested. In some cases (e.g., for qualification testing, etc.) an integrated circuit may be stressed beyond its specifications, for example, to determine failure points and/or establish a "guard band" on its environmental specifications. Some traditional approaches to temperature control included placing the DUT in an environmental chamber. The environmental chamber would heat and/or cool the integrated circuit(s) under test, (e.g., DUT, etc.) as well as the test interface and support hardware, to the desired test temperature. Unfortunately, use of such test chambers can have drawbacks. For example, the limits and/or accuracy of such testing may be degraded due to environmental limits of the test interface circuits and/or devices. In addition, due to the large volumes of air and mass of mounting structures and interface devices required within an environmental test chamber, the environment inside such a test chamber may not be changed rapidly, potentially limiting a rate of testing. Further, placing and removing DUTs and testing apparatus into and out of such test chambers further limits rates of testing, and requires complex and expensive mechanisms to perform such insertions and removals.

SUMMARY OF THE INVENTION

The presented systems and methods enable efficient and effective exchange of test support components. There are a variety of different test support components (e.g., active thermal interposer (ATI) device, exchange kit, etc.) that are configured to support various testing functions. The presented systems and methods are compatible and complementary with existing systems and methods of testing integrated circuits.

In one embodiment, an automated test equipment (ATE) system comprises: a support component configured to enable support functions associated with testing of a device under test (DUT); a support component head configured to selectively couple with the support component; and an exchange socket configured to hold the support component for a portion of selectively coupling the support component and the support component head. In one exemplary implementation, the support component is configured to provide support for testing related functions that are not necessarily directly involved in test pattern generation and communication. In one embodiment, the support component is coupled to the support component head through insertions and extractions of multiple DUTs to and from an ATE system, and the support component is replaced with another support component when a different type of DUT is inserted into the ATE system. In one exemplary implementation, the support component is an Active Thermal Interposer (ATI) device configured to provide support for controlling a thermal condition of the DUT and the support component head is a thermal head. The exchange socket can hold the support component during insertion to and extraction from a test system. The exchange socket can include transition mechanisms to control coupling and decoupling of the support component to and from the support component head.

In one embodiment, an automated test equipment (ATE) support component exchange method comprises: performing a support component placement process; performing a support component head interaction process; and performing a support component removal process. The support component placement process, the support component head interaction process, and the support component removal process can be triggered and automatically performed in response to an indication of a device under test (DUT) type changeover. In one embodiment, the support component head interaction process includes a load process and unload process, wherein during the load process the support component is selectively coupled to a support component head and lifted out of an exchange socket, and during the unload process the support component is selectively decoupled from a support component head and placed in and coupled to an exchange socket. The support component placement process includes placing a support component in an exchange socket. The support component head interaction process can include moving a support component head portion towards an exchange socket and a coupling component included on the support component head coupling with the support component. In one exemplary implementation, the support component is an Active Thermal Interposer (ATI) device configured to provide support for controlling a thermal condition of the DUT and the support component head is a thermal head. In one embodiment, the support component head interaction process includes performing an exchange socket/thermal head selective coupling process; an exchange socket/ATI decoupling process, a thermal head/ATI coupling process, a thermal head/ATI decoupling process, and an exchange socket/ATI coupling process.

In one embodiment, an automated test equipment (ATE) system comprises: a plurality of support components configured to enable support functions associated with testing of a plurality of devices under test (DUTs); a support component head configured to selectively couple with the plurality of support components; and an exchange socket configured to hold the first support component for a portion of selectively coupling the plurality of support components and the support component head. One of the plurality of support components corresponding to a second type of one of the plurality of DUTs can be removed from the exchange socket and one of the plurality of support components corresponding to a first type of one of the plurality of DUTs can be placed in the exchange socket. In one exemplary implementation, one of the plurality of support components includes an Active Thermal Interposer (ATI) device and selectively coupling the ATI device to a test head includes electrically coupling the ATI device to the test head via electrical contacts. A type of electrical contact between support component and the support component head can be selected based upon various characteristics. In one exemplary implementation, current and signals pass from the support component to the support component head via multi-point expansion pins and receptacles. In one embodiment, the plurality of ATI are automatically placed in and removed from an exchange bib that is automatically inserted to and extracted from the ATE system.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Figure 1A:
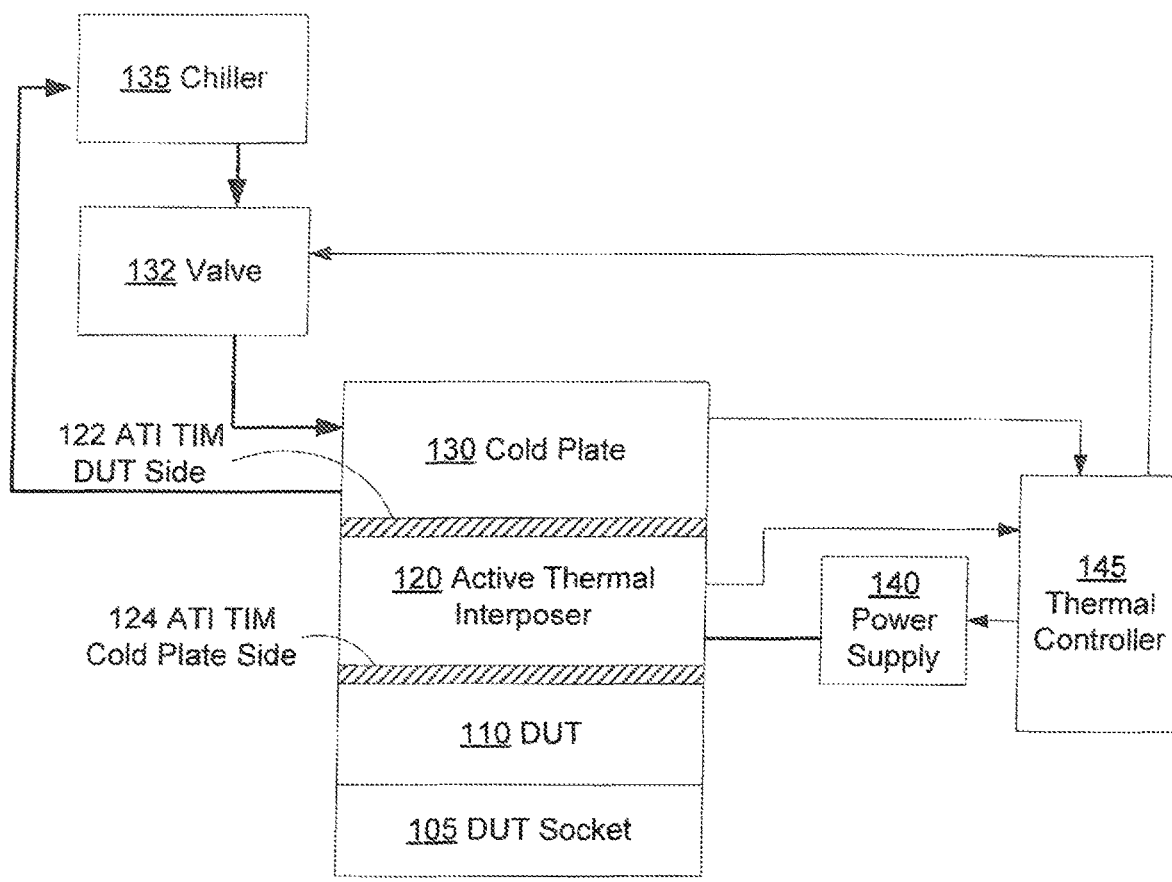
FIG. 1A is a block diagram of an exemplary automated test system environment that may serve as a platform in accordance with one embodiment.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

Advances in semiconductor chip development have created increasing demand for device testing, particularly as it relates to higher power and more complex devices. To test the devices, test systems have attempted to enable increasingly advanced testing support capabilities. Presented systems and methods include various systems and methods configured to provide these test support capabilities, including providing test support capabilities for various types of testing and different types of DUTs in an efficient and effective manner. In one embodiment, the systems and methods are configured to enable efficient and effective changes to test support capabilities associated with changes in corresponding DUTs. In one exemplary implementation, the changes to test support capabilities correspond to changes in the type of DUT being tested by a test system.

In one embodiment, the support capabilities include thermal management and control systems. The thermal management and control systems can include features such as is sold by Advantest in their System level testers (SLT) and Burn In (BI) Testers. and so on. In one exemplary implementation, the thermal control features, including thermal control technology known as the Active Thermal Interposer (ATI) (e.g., as disclosed in co-pending USPTO application Ser. No. 17/531,638 herein incorporated by reference, etc.). The ATI device has the various benefits and advantages (e.g., low thermal resistance and high-powered heating which can enable tight thermal stability, etc.).

In one embodiment, the ATI device is placed upon the Device Under Test (DUT) with each insertion of the DUT and is then engaged between the DUT and the thermal head during a test (e.g., as described in USPTO application Ser. No. 17/531,638). The ATI device can get its power and translates its temperature feedback through electrical contacts (e.g., pogo pins, multipoint expansion pins and receptacles, etc.) to the thermal head. In one exemplary implementation, an approach in which the ATI device is placed on the DUT before each insertion can be used when there is continual coupling/decoupling and engagement/dis-engagement of the ATI device and cold plate with every cycle. A benefit of this approach can be that when the machine needs to be converted for a new style of device it is quick to remove and replace ATI devices in a system. In one exemplary implementation, a time to load and un-load devices can be slowed because the ATI device has to be picked up by the handler and placed on the DUT before the DUT can be loaded.

In one embodiment, a support component (e.g., ATI device, exchange kit, etc.) is inserted to and ejected from a test system separately from insertion/ejection of the DUT. In one exemplary implementation, an exchange socket is used to hold the support component during insertion and extraction to the test system. The exchange socket is aligned with a support component head (e.g., thermal head, etc.) in the system and the support component head moves to engage/disengage with the support component (e.g., ATI device, exchange kit, etc.) resulting in the support component being selectively coupled to the support component head. In one embodiment, selective coupling includes both coupling and decoupling. The test head can include a cold plate and the ATI device can be thermally coupled to the cold plate. An ATI device can also be electrically coupled to the thermal head. After an ATI device is selectively coupled to a thermal head the thermal head with ATI can engage to test a DUT in a test Socket. In one embodiment, a DUT can be selectively coupled to the ATI device and a test socket in the test system. In one exemplary implementation, the ATI is engaged to contact one side of a DUT and a test socket can be selectively coupled to different side of the DUT. In one embodiment, an ATI device is inserted in a test system and can be used to control thermal conditions for testing of multiple DUTs (before extracting the ATI). In one exemplary implementation, a single ATI insertion/extraction cycle is used for multiple DUT insertion/extraction cycles to and from the test system. Additional explanation of the insertion/ejection of ATI devices separate from DUTs is set forth in other portions of this detailed description.

In one embodiment, an ATI device is selectively thermally coupled to a thermal head. In one embodiment, an ATI device is thermally coupled to a cold plate of the thermal head. In one exemplary implementation, the ATI device is not required to be removed from the cold plate until it is time for a DUT type changeover. In one exemplary implementation, the presented ATI device exchange approach can enable faster over-all transfer time of new devices because removing the ATI device from the test system is not required in order to exchange DUTs of the same type.

For ease of explanation, much of the detailed description refers to exchanging ATI devices on thermal heads. It is appreciated the presented systems and methods can be similarly implemented for other components (e.g., peripheral support component, exchange kits, etc.). In one embodiment, an ATI device contacts a central portion of a DUT and an exchange kit is a separate DUT specific adapter that contacts the periphery of a DUT. In one exemplary implementation, an exchange drawer is capable of exchanging the exchange kit in addition to or in place of exchanging the ATI device.

In one embodiment, a stand-alone active thermal interposer (ATI) device is used in testing a system-in-package device under test (DUT). The ATI device includes a body layer having a first surface and a second surface, wherein the first surface is operable to be disposed adjacent to a cold plate, and a plurality of heating zones are defined across the second surface of the body layer, the plurality of heating zones are operable to be controlled by a thermal controller to selectively heat and maintain respective temperatures thereof, the plurality of heating zones operable to heat a plurality of areas of the DUT when the second surface of the body layer is disposed adjacent to an interface surface of the DUT during testing of the DUT. In one embodiment, the stand-alone active thermal interposer (ATI) device is coupled to thermal head and controlled by a test system.

FIG. 1A is a block diagram of an exemplary automated test system environment 100 that may serve as a platform in accordance with one embodiment. Test system 100 is configured to test a device under test (DUT) 110 (e.g., an integrated circuit device, a system in a package (SIP), a multi-chip module (MCM), etc.). The DUT is typically packaged, but that is not required. A test socket 105 is electrically coupled to device under test 110 (e.g., utilizing package leads on the DUT 110, etc.) by a contact component configured to convey test signals and power to/from DUT 110. Test socket 105 is typically coupled to, and tests, a single device under test 110 at a time, although that is not required. Test socket 105 may be mounted to, or coupled to, a load board (not shown) for electrically coupling the test socket 105 to a test controller (e.g., for electrical testing of DUT 110, etc.).

In one embodiment, a novel active thermal interposer (ATI) device 120 is coupled to the backside or top of DUT 110. In one exemplary implementation, ATI device 120 can be customized for a specific design of DUT 110. In one embodiment, there may be a thermal interface material 122 between ATI device 120 and DUT 110. Such a thermal interface material, if present, is designed to improve thermal coupling between ATI device 120 and DUT 110.

In one embodiment, the thermal head comprises a cold plate which is thermally coupled with an ATI device during testing (e.g., ATI device 120 is thermally coupled to a cold plate 130, etc.). In one embodiment, there may be a thermal interface material 124 between ATI device 120 and cold plate 130. In one exemplary implementation, the thermal interface material is configured to improve thermal coupling between ATI device 120 and cold plate 130. In one exemplary implementation, an ATI device is exchanged during changeovers between DUT types and the thermal interface material does not wear down as fast as when an ATI device is exchanged with each insertion of a DUT of the same type.

In one embodiment, heating elements in the ATI device and a cooling fluid (e.g., glycol, air, etc.) circulated through cold plate 130 can enable thermal control features. Various components (e.g., chiller 135, valve 132, thermal controller 145, poser supply 140, etc.) can participate in the heating/cooling. It is appreciated, presented ATI exchange approaches can be utilized with various types of cooling systems (e.g., TEC Thermo-Electric cooler type of thermal head, liquid cooled thermal head, air cooled thermal head, etc.)

In one embodiment, thermal controller 145 may implement some or all of the control processes described in U.S. Pat. No. 9,291,667 entitled "Adaptive Thermal Control," incorporated herein by reference in its entirety.

In one embodiment, ATI device 120 functions to apply heat energy to one or more temperature regions of DUT 110. In one exemplary implementation, ATI device 120 includes thermal components (e.g., heating elements, temperature measurement device, etc.) configured to participate in the thermal control. In one embodiment, thermal component/elements of ATI device 120 also define temperature regions of DUT 110. It is appreciated thermal components/elements can include various configurations (e.g., resistive traces on a ceramic substrate, a cartridge heater, heating element, cooling element, cooling elements, element capable of both heating and cooling, Peltier devices, other forms of thermoelectric coolers (TEC), et.). In one embodiment, ATI device 120 can also function to couple heat energy from DUT 110 to cold plate 130 and/or to cooling elements within ATI device 120. In one exemplary implementation, the DUT is slightly higher than a floating plate of a test socket to allow the ATI device to engage cleanly against only the DUT (e.g., avoid unintended electrical contact with other components, etc.)

In one embodiment, test socket 105, DUT 110, ATI device 120, and cold plate 130 may be collectively known as or referred to as a test stack when coupled together as illustrated in FIG. 1A.

In one embodiment cold plate 130 can extract heat (e.g., through ATI device 120, etc.) from DUT 110. In addition, cold plate 130 typically has a large thermal mass, and does not change temperature quickly. Accordingly, heating elements of ATI device 120 may often be required to overcome the cooling effect of cold plate 130, during DUT testing, for example. In one embodiment, different regions of a DUT 110 may be heated and/or cooled to different temperatures. For example, one region of DUT 110 may be heated to 100 degrees C., e.g., via a heater within ATI device 120, while another region of DUT 110 may be allowed to cool toward the temperature of cold plate 130 with no heat applied to such region by ATI device 120. In one embodiment, such differential heating and/or cooling of different regions of DUT 110 may produce a thermal gradient across or between regions of DUT 110.

It is appreciated that ATI device 120 can be a separate device from cold plate device 130 and test socket device 105. ATI device 120 is typically customized for a particular DUT and/or socket combination, but that is not required. In this novel manner, since the ATI device can be considered a standalone device, different ATI devices may be utilized with standard cold plates and/or a variety of test sockets in various combination to test a variety of devices. For example, a functionally similar multi-chip module may have multiple versions with similar or identical pin layouts but a different physical arrangement of chips. Testing of such a family could be performed with the same test socket and different ATI devices (e.g., to account for a different physical arrangement of chips, etc.).

Figure 1B:
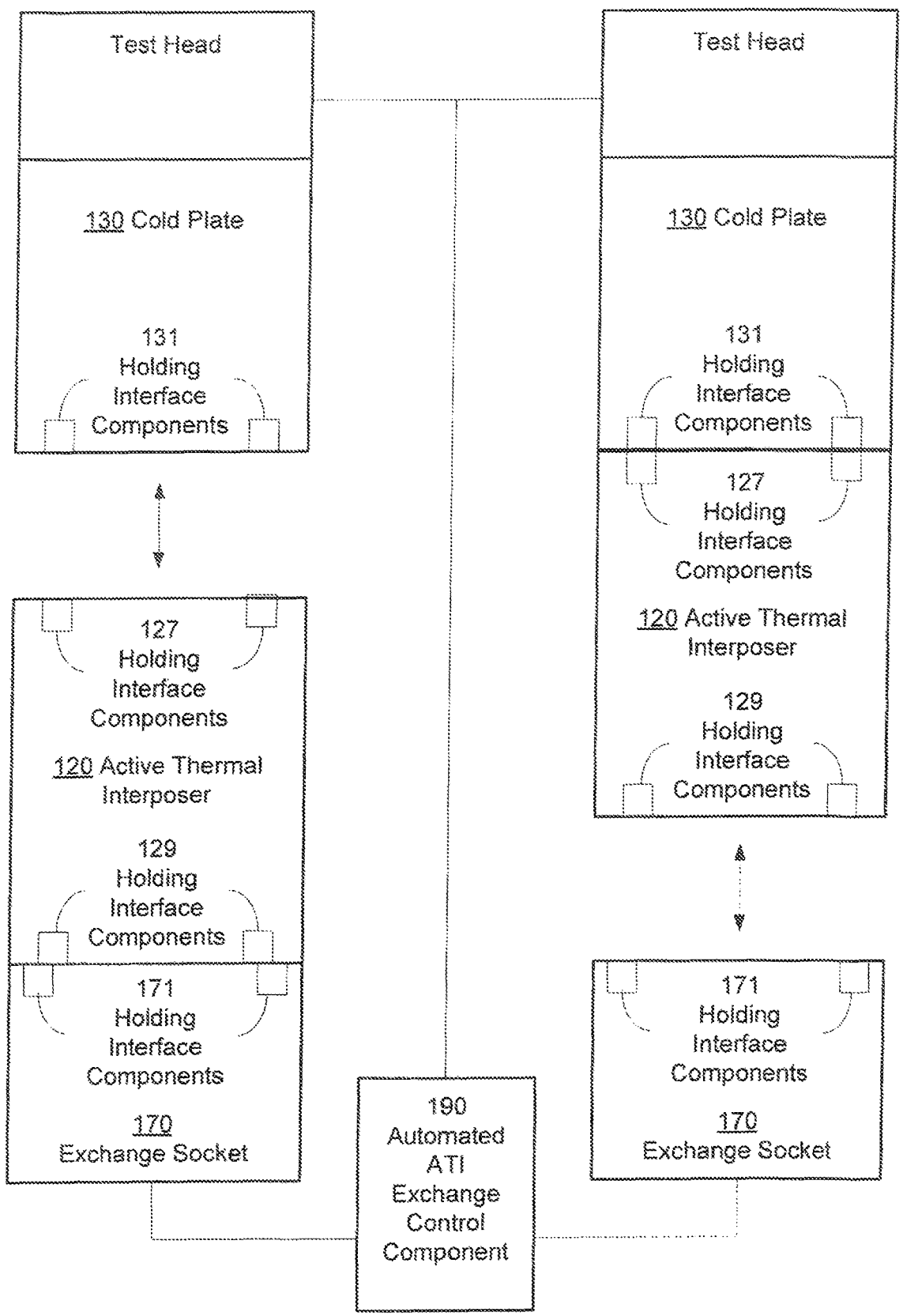
FIG. 1B is a block diagram of an exemplary automated test system ATI exchange approach in accordance with one embodiment.

FIG. 1B is a block diagram of an exemplary novel ATI exchange approach in accordance with one embodiment. In one embodiment, cold plate 130, ATI device 120 and exchange socket 170 include respective holding interface component (e.g., 131, 127, 129, 171, etc.). The respective holding interface components selectively couple the cold plate 130 to ATI device 120 and ATI device 120 to exchange socket 170 depending upon which stage an exchange process is in. It is appreciated there may be other interfaces or coupling aspects of the components (e.g., thermal interface material between the cold plate and ATI, etc.). In one exemplary implementation, the respective holding interface components selectively/temporarily hold a component in place coupled to another component.

In one embodiment, during an initial/insertion stage of an ATI exchange, holding interface components 171 interact with holding interface components 129 to selectively hold/couple the ATI device 120 to the exchange socket 170 while the ATI is in the process of being added/coupled to a test head. Similarly, during a final/removal stage of an ATI exchange, holding interface components 171 interact with holding interface components 129 to hold/couple the ATI device 120 to the exchange socket 170 while the ATI is in the process of being removed/decoupled from a test head. In the illustration on the left of FIG. 1B the ATI device 120 is temporarily coupled to the exchange socket 170. In between insertion and removal, the holding interface components 127 interact with holding interface components 131 to hold/couple the ATI device 120 to the cold plate 130 (e.g., while the ATI is being utilized during testing of DUTs, etc.). In the illustration on the right of FIG. 1B the ATI device 120 is normally coupled to the cold plate 130.

Figure 2A:
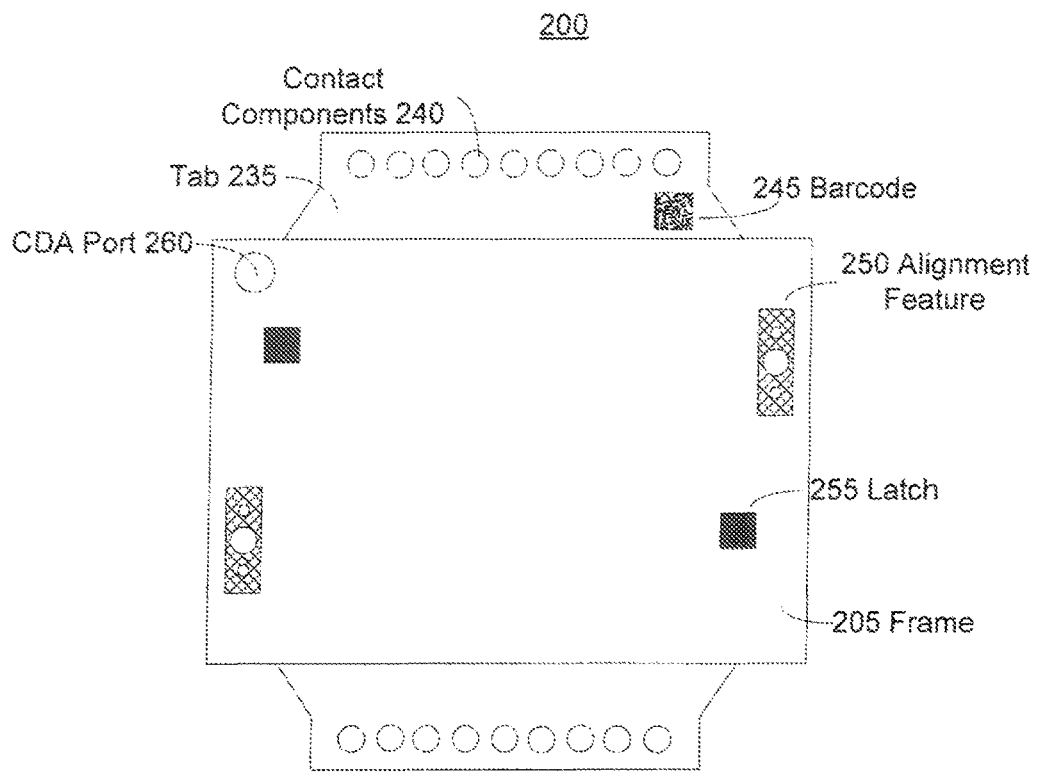
FIG. 2A is a block diagram of an exemplary novel active thermal interposer (ATI) device in accordance with one embodiment.

FIG. 2A is a block diagram of one side of an exemplary novel active thermal interposer (ATI) device 200 in accordance with one embodiment. ATI device 200 includes a frame 205 upon which other elements may be attached or mounted. Frame 205 can include tabs 235 configured to handle and/or manipulate ATI device 200 (e.g., by automated grasping equipment and/or pick and place equipment, etc.). In one embodiment, ATI device 200 is similar to ATI device 120. A plurality of contact components 240 configured to enable electrical coupling of the ATI device 200 to other components (not shown in FIG. 2A).

ATI device 200 can include ATI latches 255 configured to securely couple other components (e.g., an exchange socket, thermal head, etc.) to the ATI device 200. ATI device 200 can include alignment features 250 (e.g., fiducial alignment markings and/or receptacles, micro-alignment bushings, alignment pin sockets etc.), to assist and/or ensure alignment of ATI device 200 into a test stack (e.g., as described with respect to FIG. 1, etc.).

For example, contact components 240 may be configured to mechanically and electrically couple with contact components 240 (e.g., electrical contacts/pads, expansion pins and receptacles, pogo pins, etc.) to couple electrical power and/or thermal sensor signals to/from active thermal interposer device 200. In one embodiment, active thermal interposer device 200 may comprise one or more compressed dry air (CDA) ports 260, which may be coupled to a source of dry air, and utilized to inject dry air into the test stack in order to prevent condensation or used to assist in the disengagement of the DUT from the ATI. In one embodiment, active thermal interposer device 200 may comprise an insulative cover (not shown) to help prevent condensation. In one embodiment, a test socket and active thermal interposer device 200 comprise features to prevent the active thermal interposer device 200 from making undesired electrical contact with electrical contacts of the test socket if a device under test is not present. In one exemplary implementation, a hard stop on the thermal head can contact a surface of the socket outside of a footprint of a DUT to prevent such undesired contact. In one embodiment, ATI device 200 can include a barcode 245 for identification purposes. Uniquely identifying an ATI device may be utilized to record and track which particular ATI device 200 is used with a particular exchange socket, test socket, DUT, and so on. The barcode can contain calibration information related to the ATI heater, and temperature sensor.

Figure 2B:
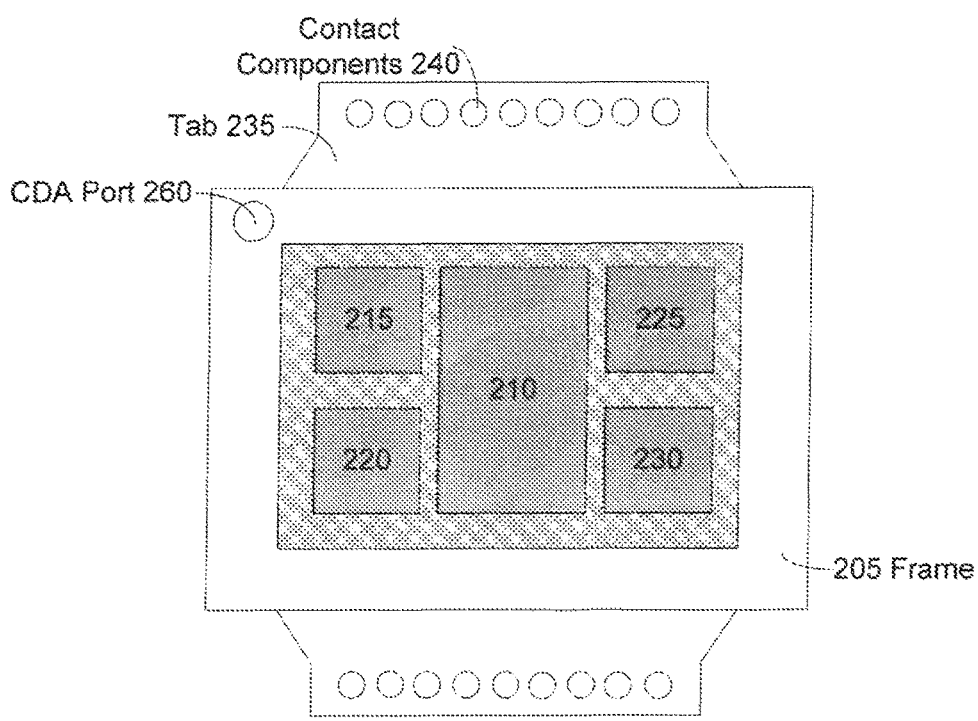
FIG. 2B is a block diagram of another side of the exemplary novel active thermal interposer (ATI) device in accordance with one embodiment.

FIG. 2B is a block diagram of another side of exemplary novel active thermal interposer (ATI) device 200 in accordance with one embodiment. In one embodiment, ATI device 200 may comprise a plurality of active thermal regions or zones 210, 215, 220, 225, and 230. In one embodiment, there may be a single thermal region. Each thermal region may correspond to a region of a device under test. For example, active thermal region 210 may correspond to a large die of a multi-chip module, which active thermal regions 215, 220, 225, and 230 correspond to other and/or smaller chips of the multi-chip module. In one embodiment, multiple thermal regions may correspond to a single die or chip. Each of active thermal regions 215, 220, 225, and 230 can be configured to selectively apply thermal energy to a DUT. The active thermal regions 215, 220, 225, and 230 can also be configured to selectively extract thermal energy from a DUT. The extraction of thermal energy may be via various mechanisms (e.g., coupling to a cold plate, a Peltier device, etc.). Each active thermal region may be independently controlled to a different temperature.

A system may include various features for enabling/assisting coupling/decoupling of an ATI device and a DUT (e.g., a DUT lift pin, a DUT air-powered kick off device in response to pressure applied via compressed dry air (CDA) port, a DUT spring loaded kick off device to push against a DUT, etc.).

Figure 3:
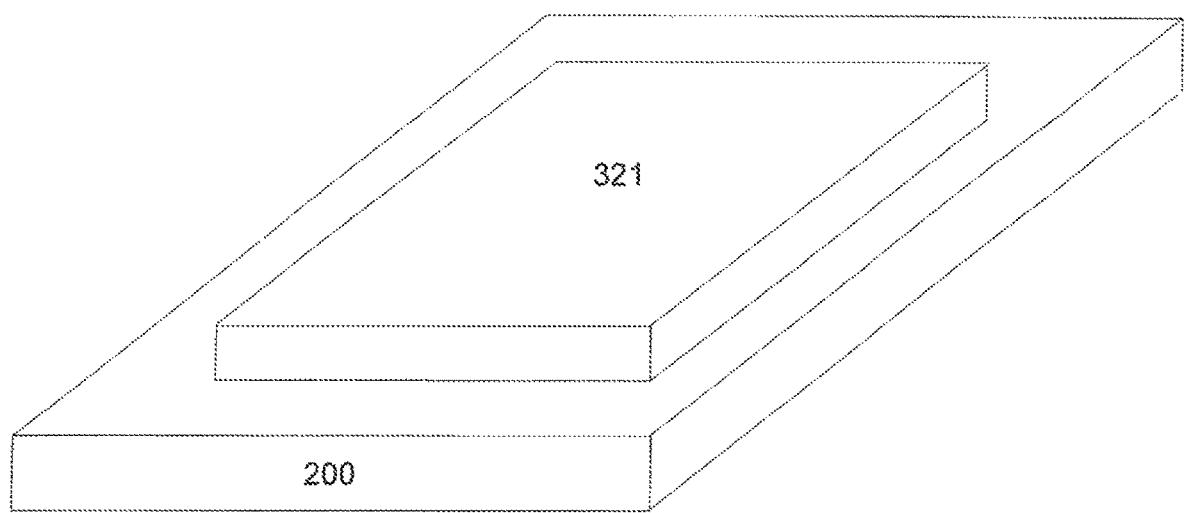
FIG. 3 is a block diagram of an exemplary ATI device coupled to a cold plate in accordance with one embodiment.

FIG. 3 is a block diagram of an exemplary ATI device 200 coupled to a cold plate 321 in accordance with one embodiment.

Figure 4A:
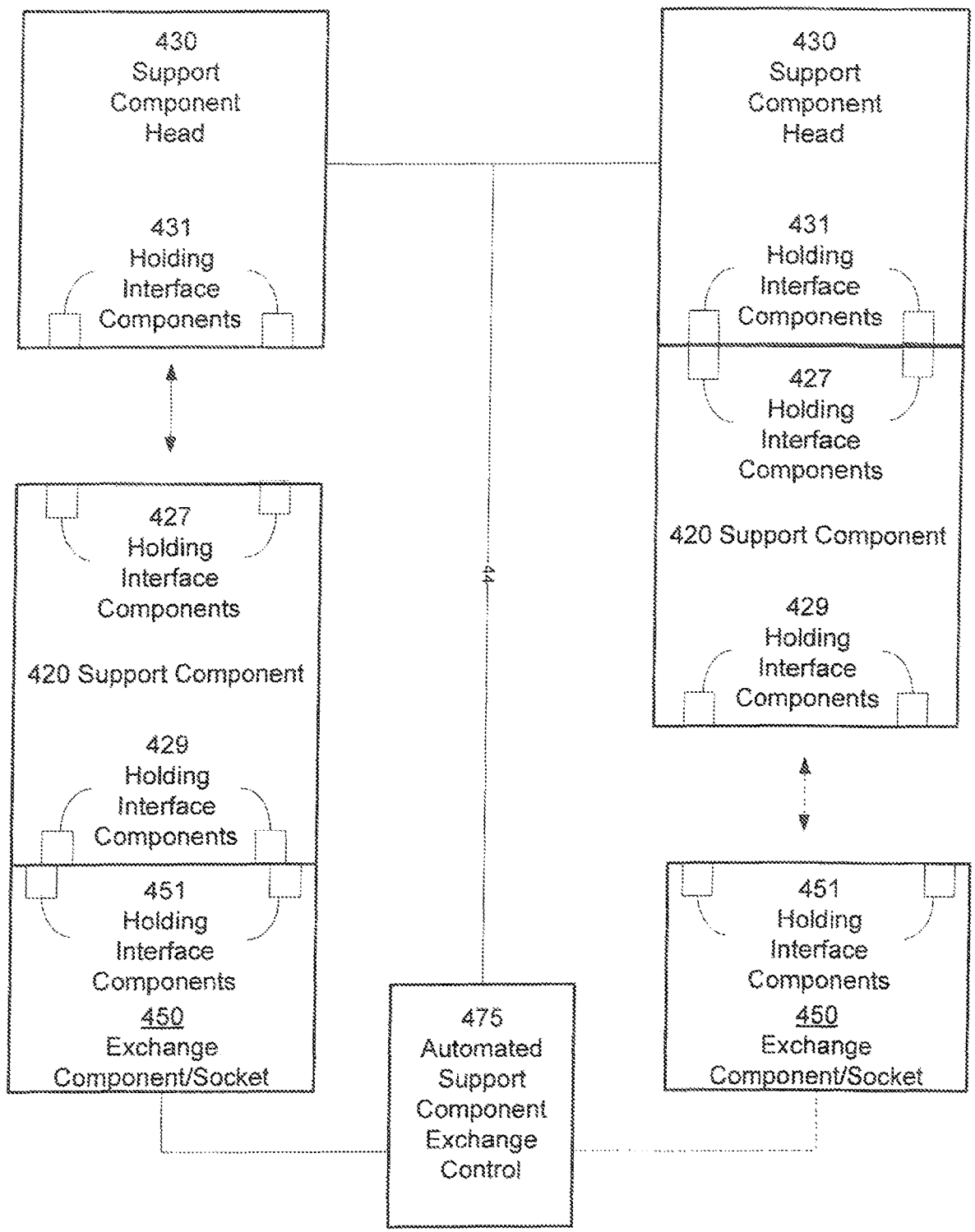
FIG. 4A is a block diagram of an exemplary novel support component exchange approach in accordance with one embodiment.

FIG. 4A is a block diagram of an exemplary novel support component exchange approach in accordance with one embodiment. In one embodiment, support component head 430, support component 420 and exchange component 450 include respective holding interface components (e.g., 431, 427, 429, 451, etc.). The respective holding interface components selectively couple the support component head 430 to the support component 420 and the support component 420 to exchange component 450 depending upon which stage an exchange process is in. It is appreciated there may be other interfaces or coupling aspects of the components (e.g., thermal interface material between the cold plate and ATI, etc.). In one exemplary implementation, the respective holding interface components include coupling components/mechanisms that selectively/temporarily hold a component (e.g., support component head 430, support component 420, exchange component 450, etc.) in place coupled to another component.

In one embodiment, during a first/initial/insertion stage of a support component exchange, holding interface components 451 interact with holding interface components 429 to selectively hold/couple the support component 420 to the exchange component 450 while the ATI is in the process of being added/coupled to a test head. Similarly, during a second/final/removal stage of a support component exchange, holding interface components 451 interact with holding interface components 429 to hold/couple the support component 420 to the exchange component 450 while the support component 420 is in the process of being removed/decoupled from a support component head. In the illustration on the left of FIG. 4A the support component 420 is temporarily coupled to the exchange component 450. In between insertion and removal, the holding interface components 427 interact with holding interface components 431 to hold/couple the support component 420 to the support component head 430 (e.g., while the support component is being utilized during testing of DUTs, etc.). In the illustration on the right of FIG. 4A the support component 420 is normally coupled to the support component head 430 during actual testing of the DUT.

Figure 4B:
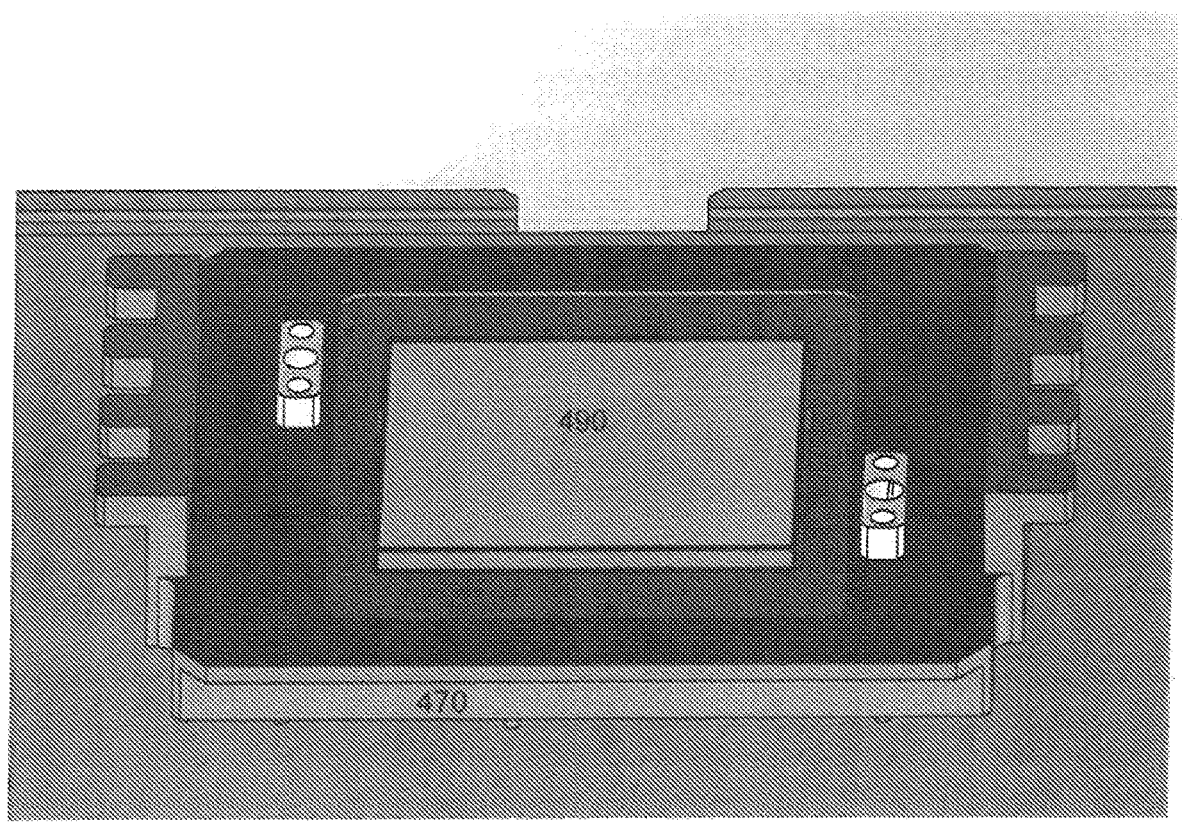
FIG. 4B is a block diagram of an exchange socket with a DUT in accordance with one embodiment.

In one embodiment, an exchange socket is configured similar to a test socket (e.g., an exchange socket can be structurally similar to a test socket, etc.). FIG. 4B is a block diagram of an test socket with a DUT in accordance with one embodiment. Test socket 470 includes a body that is used to hold DUT 490. In one exemplary implementation, test socket 470 holds DUT 490 while DUT device 490 is being selectively inserted to and extracted from a test system.

In one embodiment, in order to maintain the fast changeover time between products/DUTs an exchange socket is configured to facilitate engagement/disengagement of an ATI device with a thermal head. In one exemplary implementation, the ATI device is held to the cold plate by spring loaded clamps when engaged. To load/un-load the ATI device between the exchange socket and the thermal head, the clamps are manipulated (e.g., opened, closed, etc.) when the ATI device is loaded/un-loaded between the exchange socket and the thermal head.

Figure 5:
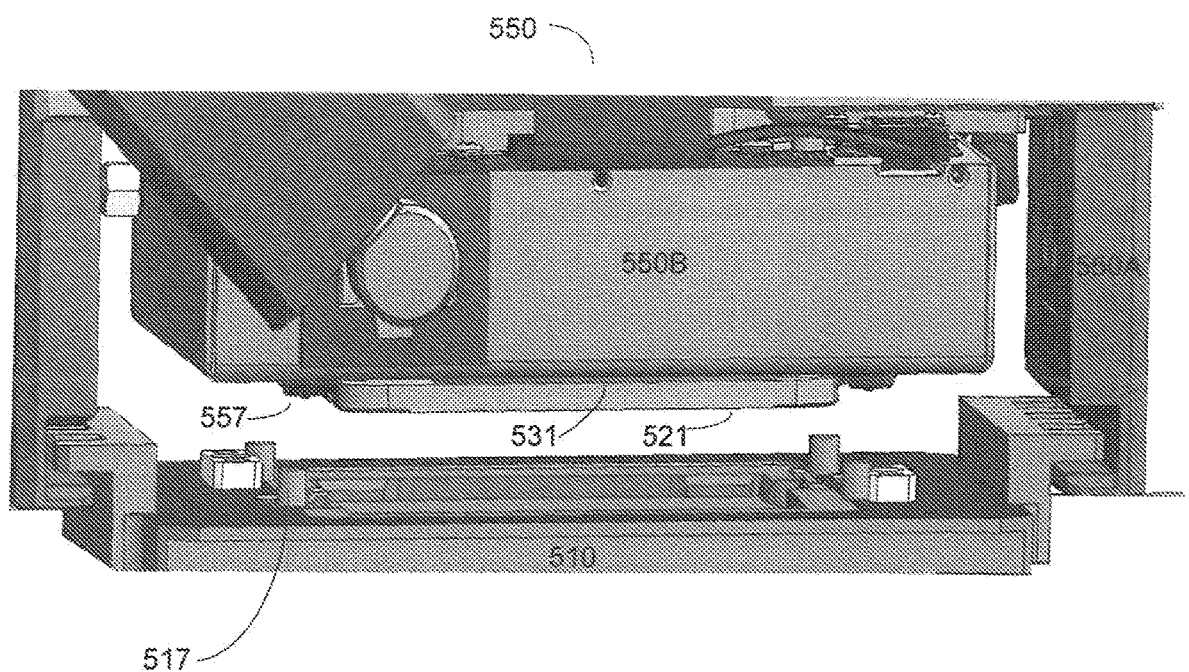
FIG. 5 is a block diagram of an exemplary ATI exchange system in accordance with one embodiment.

FIG. 5 is a block diagram of a portion of an exemplary ATI exchange system in accordance with one embodiment. In one exemplary implementation, an exchange system can enable quick tool changeover time from one type of DUT to another type of DUT. In one embodiment, this is accomplished via an exchange socket system. In one embodiment, ATI device 521 is held in exchange socket 510 during insertion/extraction to and from the thermal head 510. In one embodiment, ATI device 521 is held in exchange socket 510 similar to the way DUT 490 is held in test socket 470. In FIG. 5, exchange socket 510 is selectively coupled with thermal head 550. ATI device 521 can be selectively coupled by a coupling component/mechanism (e.g., clamp, latch, etc.). In one exemplary implementation, cold plate 531 is coupled to thermal head 550 and ATI device 521 is selectively coupled cold plate 531 via spring clamp 557.

In one embodiment, during an exchange of an ATI device, the exchange socket is inserted into a portion 550A of a thermal array. The thermal head portion 550B is actuated down onto the exchange socket 510 and a coupling component/mechanism couples the ATI device to the head portion 550B. In one exemplary implementation, the exchange socket has pins 517 that interface to the ATI spring clamps 557 to enable the opening of the spring clamps 557. In one embodiment, the ATI device is selectively coupled to the cold plate and held via a high-power connection. After the ATI device 521 is thermally coupled to the cold plate 531, the thermal head portion 550B can retract, resulting in the clamps 557 closing and holding/securing the ATI device 521 in a position thermally coupled to cold plate 531. After the thermal head retracts with the ATI device 521 coupled to the thermal head portion 550B, the exchange socket 510 is empty (does not hold ATI device 521) and the exchange socket 510 can be removed from the test system.

In one embodiment, to unload ATI device 521, a "reverse" procedure is employed. The same exchange socket 510 or a modified version (for unloading) can be used to release the ATI device 521 from the cold plate 531 and thermal head 550. An exchange socket can also have clamps (not shown) which act to grasp features of the ATI device and hold the ATI to the exchange socket when the thermal head retracts. When populated with the "removed" ATI device that was previously mounted to the cold plate 531, the test socket 510 holding the ATI device 521 can be extracted from the test system.

In one embodiment, an exchange socket can be cycled out of the test system for manual or automated removal of the ATI devices from the exchange socket. An exchange socket can retrieve the ATI devices from a next slot until multiple ATI's are removed from the test system. In one embodiment, test system includes 12 slots and each slot includes 6 exchange sockets. In one exemplary implementation, 72 DUTs with corresponding ATI devices can be tested simultaneously. In one embodiment, a slot can test 24 DUTS and several test chambers can be combined to support testing of up to 720 DUTS. In one embodiment, after testing, an ATI device may be reused to test other DUTs.

Figure 6:
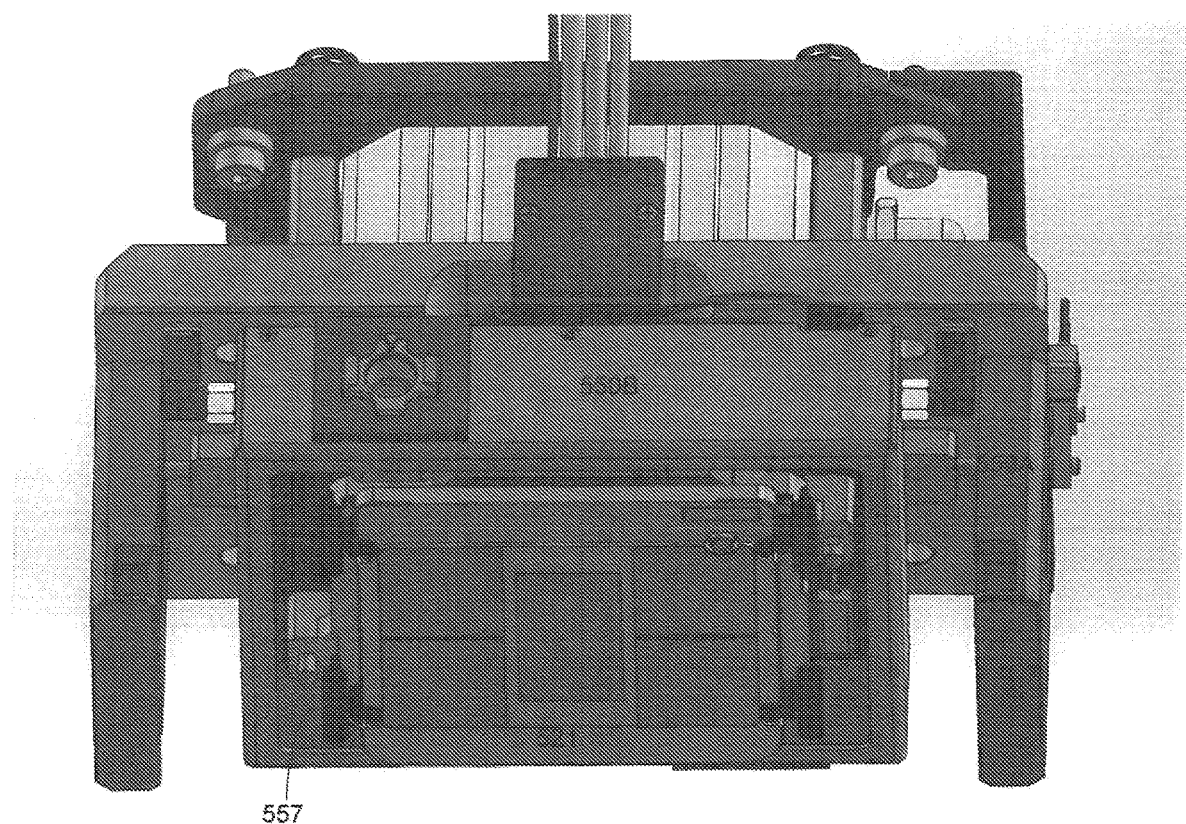
FIG. 6 is a block diagram of an exemplary ATI exchange system in accordance with one embodiment.

FIG. 6 is another block diagram of an exemplary ATI exchange system in accordance with one embodiment.

Figure 7:
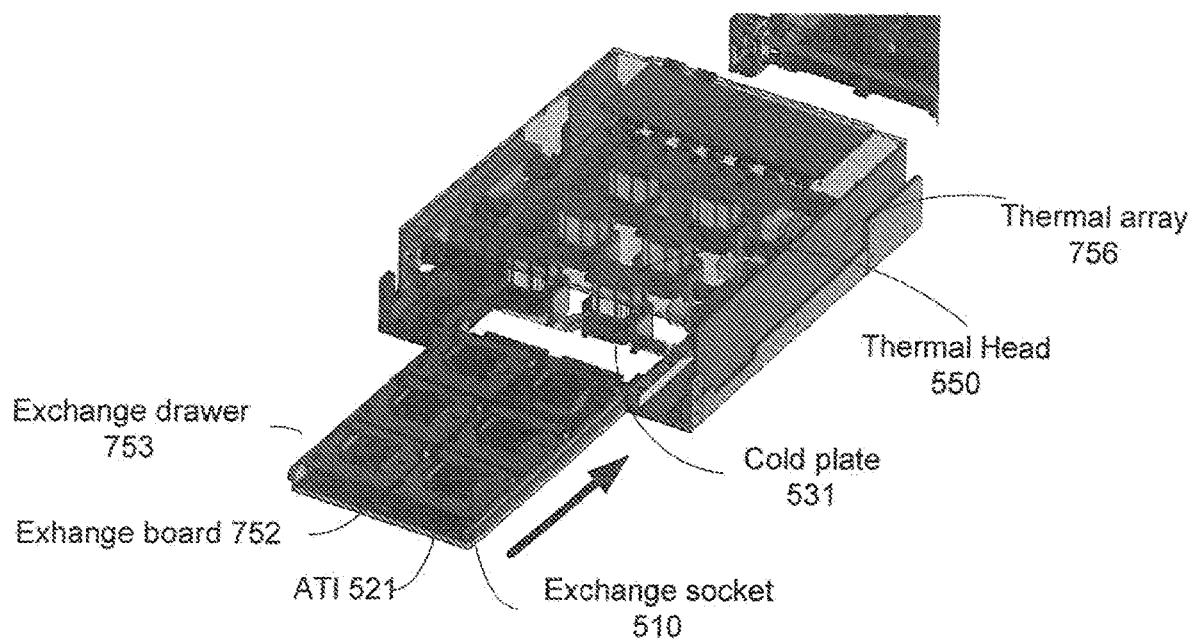
FIG. 7 is a block diagram of an exemplary thermal array in accordance with one embodiment.

FIG. 7 is a block diagram of an exemplary thermal array 700 in accordance with one embodiment. In one exemplary implementation, thermal array 756 includes a plurality of thermal heads (e.g., 550 including cold plate 531, etc.). In one exemplary implementation, thermal array 756 is configured to accept exchange drawer 753, which may be inserted into the main body of thermal array 756. Exchange drawer 753 can include an exchange board 752. Exchange board 752 can include a plurality of exchange sockets (e.g., exchange socket 510, etc.). The exchange sockets can include ATI devices (e.g., ATI device 521, etc.).

In one embodiment, thermal array 756 can be configured to include a plurality of thermal heads (e.g., six, eight, etc.). In which, each thermal head consists of a thermal stack. It is appreciated a novel ATI exchange system can be utilized to create a portion of a stack in a thermal array by thermally coupling an ATI device to a cold plate and thermal head. After the ATI devices are selectively coupled to a thermal head, DUTs and test sockets can be selectively coupled to the ATI devices to form a stack.

In one embodiment, thermal array 156 further comprises power distribution, and couplings to power, electrical test signals, and cooling fluids. Thermal array 156 is configured to couple the plurality of cold plates to the stacks 154 when exchange drawer 153 is inserted into the thermal array 156. In one embodiment, exchange board 752 is similar to an exchange bib (e.g., includes multiple exchange sockets, etc.).

In one embodiment, selectively coupling an ATI device to a test head includes electrically coupling the ATI device to the test head. A type of electrical contact between the ATI device and thermal head can be selected based upon various characteristics. In one embodiment, one type of electrical contact may wear down faster with multiple uses (e.g., pogo-pins and pads, etc.) than another type of electrical contact (e.g., multipoint expansion pin and receptacles, etc.), and the longer lasting electrical contact can be utilized. The ATI device can get its power and communicate temperature feedback through the electrical contacts (e.g., pogo pins, multipoint expansion pins and receptacles, etc.) to the thermal head. The electrical contacts can be used to convey electrical signals associated with various functions (e.g., power for a heating component, resistance temperature detector (RTD), thermal control, etc.). In one embodiment, a system uses multi-point expansion pins and receptacles to pass current and signals from the ATI device to the thermal head and thermal array. In one exemplary implementation, the multi-point expansion pin and receptacles can be similar to those conventionally used for highly reliable electrical connection (e.g., power, signal, etc.) even at high power to pass current and signals.

Figure 8:
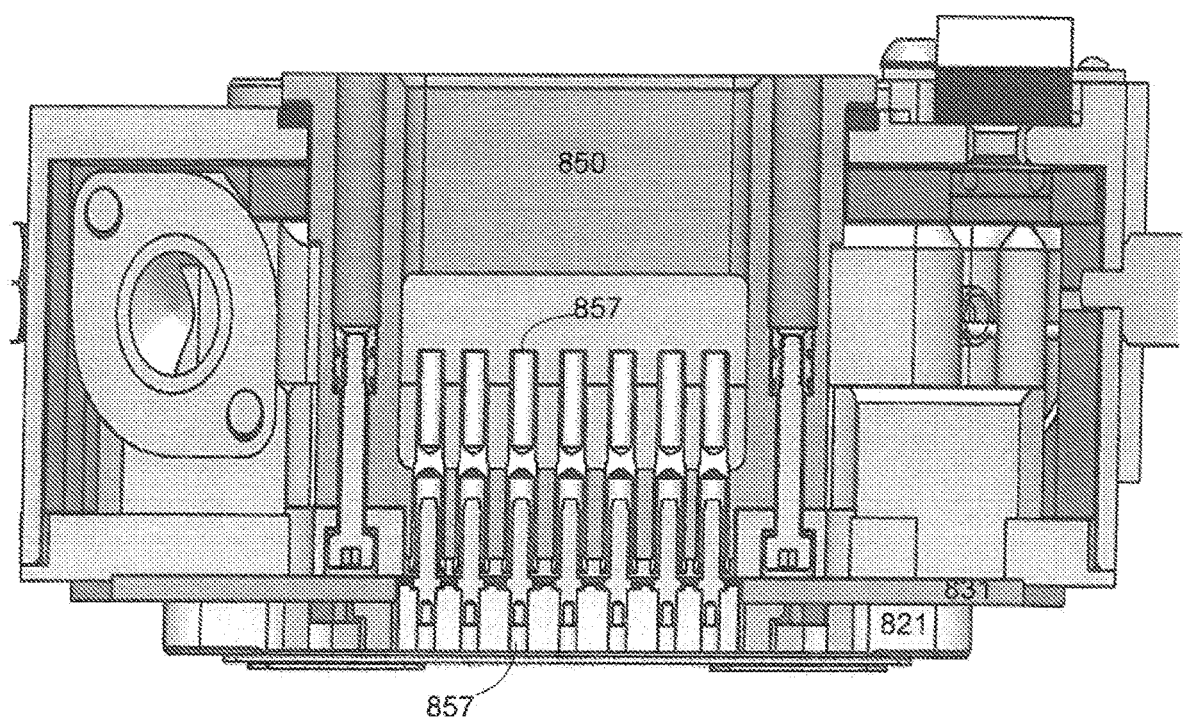
FIG. 8 is a block diagram of a test head system in accordance with one embodiment.

FIG. 8 is a block diagram of a test head system in accordance with one embodiment. In one embodiment, the test head system includes ATI device 821, test head 850 and cold plate 831 selectively coupled to ATI device 821. In one exemplary implementation, the selective coupling includes electrical coupling via expansion pins (e.g., 857A, etc.) of ATI device 821 and receptacles (e.g., 877, etc.) of test head 850B.

In one embodiment, an ATI device can be considered a "stand alone" device because it is not permanently attached to any other device within the testing system (e.g., unlike traditional testing systems and environments, etc.). Thus, an ATI device can be custom designed for a DUT. The ATI device can be actively picked and placed as a standalone part, and inserted into an exchange socket as described herein. In one embodiment, an exchange socket can be used for different types of ATI devices. In one exemplary implementation, in order to redesign/reconfigure the testing system for use with another type of DUT, only the ATI device, the DUT and the test sockets need to be redesigned/reconfigured, while the remainder of the testing system, including a cold plate and thermal head, may be reused.

Figure 9:
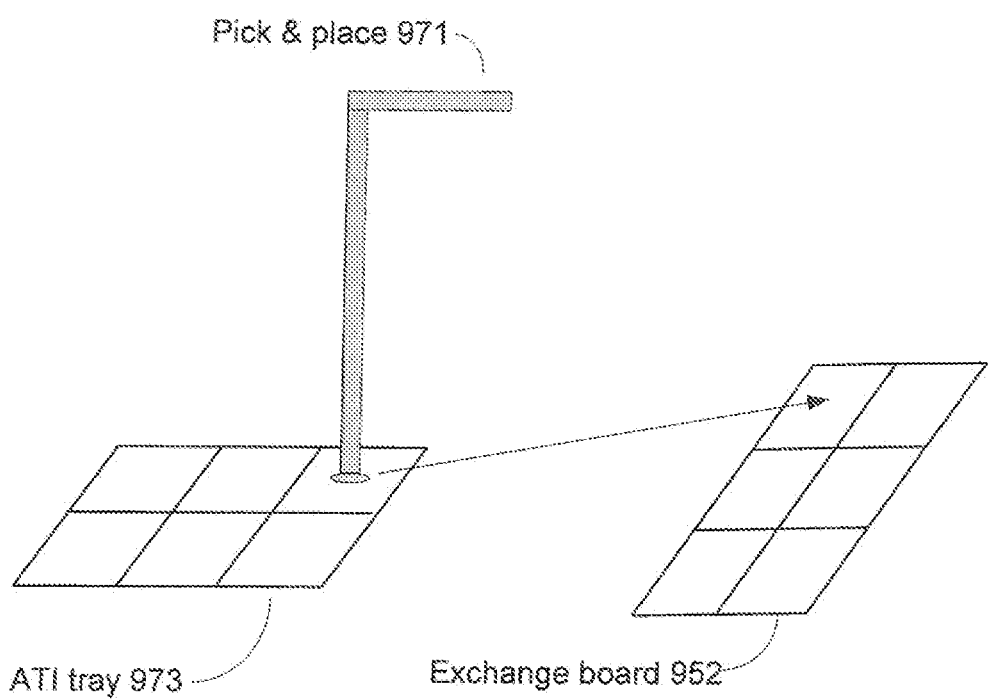
FIG. 9 is a block diagram of exemplary robotic mechanisms for automatically picking and placing an ATI device in an exchange socket in accordance with one embodiment.

FIG. 9 is a block diagram of exemplary robotic mechanisms for automatically picking and placing an ATI device in an exchange socket in accordance with one embodiment. After placement into the thermal socket, the thermal socket holds the ATI device as the ATI device and thermal socket are moved to the test system. In one embodiment, the thermal socket and ATI device are placed in a thermal array (e.g., similar to thermal array 756, etc.). A pick and place arm 971 retrieves an ATI device from ATI tray 973 and places the ATI device in exchange board 952. The exchange board 952 can be similar to exchange board 752 of FIG. 7. The pick and place arm 171 can pick up an ATI device via any suitable method (e.g., grasping on sides, via vacuum suction, etc.). An ATI can include various identification indications (e.g., markings, barcode, etc.).

Figure 10:
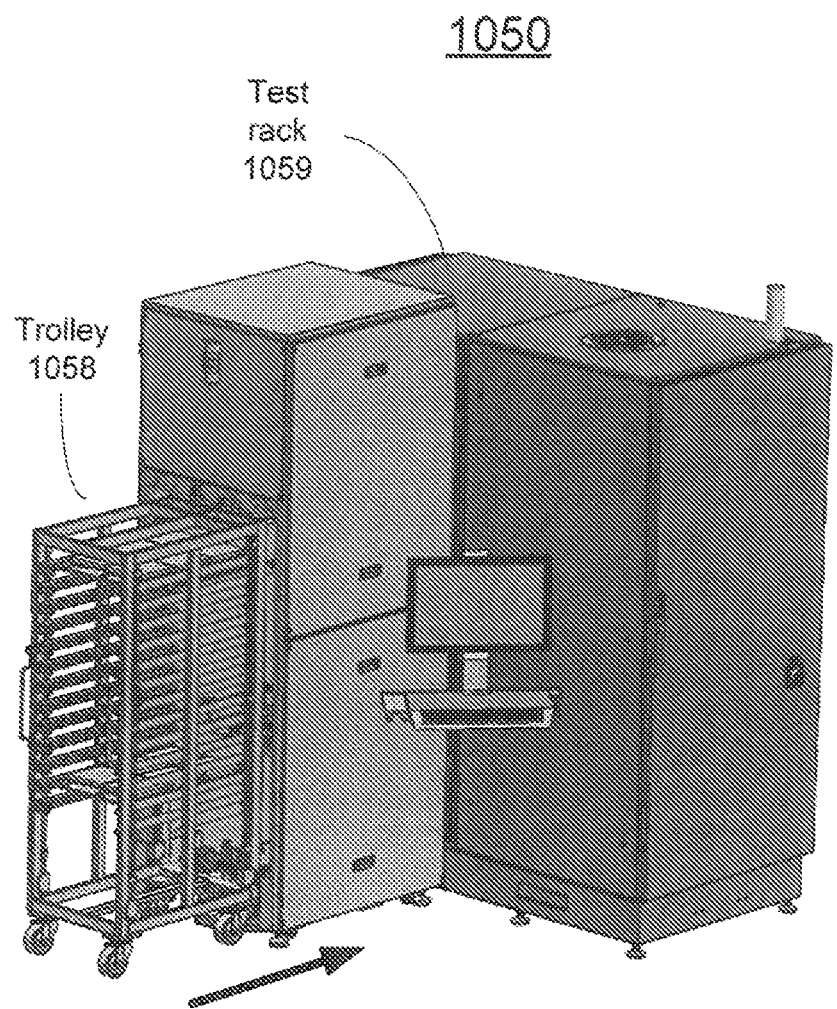
FIG. 10 is a block diagram of an exemplary test system in accordance with one embodiment.

FIG. 10 is a block diagram of an exemplary test system 1050 in accordance with one embodiment. A plurality of thermal arrays (e.g., similar to thermal arrays 756, etc.) are configured to be selectively placed in slots of the Test Rack 1059. When inserted into test rack 1059, electrical power, test signals, and cooling are supplied to test stacks included in the thermal array. A test stack can include a cold plate, an ATI device, a DUT and a test socket (similar to a stack in FIG. 1, FIG. 7, etc.). A test stack can include DUTs that are asynchronously tested by test system 1050. In one exemplary implementation, 72 devices can be thermally controlled (e.g., heated, cooled, etc.) and electrically testing performed for some portions of the ATIs in parallel/concurrently.

In one embodiment, the trolley 1058 can be employed to insert the exchange drawer 753 into each of the respective slots of test rack 1059.

In one embodiment, an automated test equipment (ATE) system comprises: a support component (e.g., ATI device, exchange kit, etc.) configured to enable support functions associated with testing of a device under test (DUT); a support component head (e.g., thermal head, etc.) configured to selectively couple with the support component; and an exchange socket configured to hold the support component for a portion of selectively coupling the support component and the support component head. There can be various types of support components (e.g., ATI device, exchange kit, etc.) that are exchanged in the test system. Selective coupling can include both coupling and decoupling of the support component to and from the support component head. In one embodiment, a support component (e.g., ATI device, exchange kit, etc.) can be configured to selectively couple with a DUT. In one embodiment, a support component is placed and held in an exchange socket during loading and unloading operations.

The exchange or selective coupling can occur as the ATE system changes from testing a first type of DUT to a second type of DUT. In one embodiment, the support component is coupled to a support component head for testing of multiple DUTs of the same DUT type and the support component selectively decouples/releases the support component based upon a release trigger. There can be various release triggers (e.g., indication of a DUT type change, predetermined number of test cycles, predetermined number of the multiple DUTs, etc.). In one embodiment, a thermal head can be selectively coupled to an ATI device during and in between testing of DUTs of a similar type and selectively decoupled in between testing of DUTs of a different type. It is appreciated the selective coupling can include various types of coupling (e.g., thermal coupling, electrical coupling, mechanical coupling, structural coupling etc.). A mechanical/structural coupling interface can include various coupling components/mechanisms (e.g., a clamp, a latch, spring loaded clasp, lift off pin/button, vacuum, etc.). An electrical coupling interface can include various electrical coupling components/mechanisms (e.g., electrical contact component, expansion pin and receptacle configuration, pogo pin configuration, etc.). In one embodiment, the electrical coupling component/mechanism can convey input voltage/current signals from a thermal head for supply to a plurality of heater zones in an ATI device and also operable to output temperature sensor data corresponding to said plurality of heater zones. An ATI device and thermal head can include alignment features configured to aid alignment of the ATI device and thermal head. In one embodiment, a thermal head can include a cold plate and the ATI device is thermally coupled to the cold plate.

In one embodiment, the support component is configured to provide support for testing related functions that are not necessarily directly involved in test pattern generation and communication. The support component can be configured to provide support for controlling a thermal condition of the DUT. In one exemplary implementation, a support component is an Active Thermal Interposer (ATI) device and the support component head is a thermal head.

In one embodiment, the exchange socket holds the support component while it is inserted/extracted to/from a test system. The exchange socket can include selective coupling mechanisms (e.g., catches, latches, etc.) and transition mechanisms (e.g., pins, motors, cams, bushing tract, etc.) that control (e.g., move, manipulate, direct, etc.) the selective coupling mechanisms.

The exchange socket can be included in an exchange kit. The exchange kit can include an exchange bib for holding the exchange socket. In one exemplary implementation, an exchange bib can hold multiple change sockets.

Figure 11:
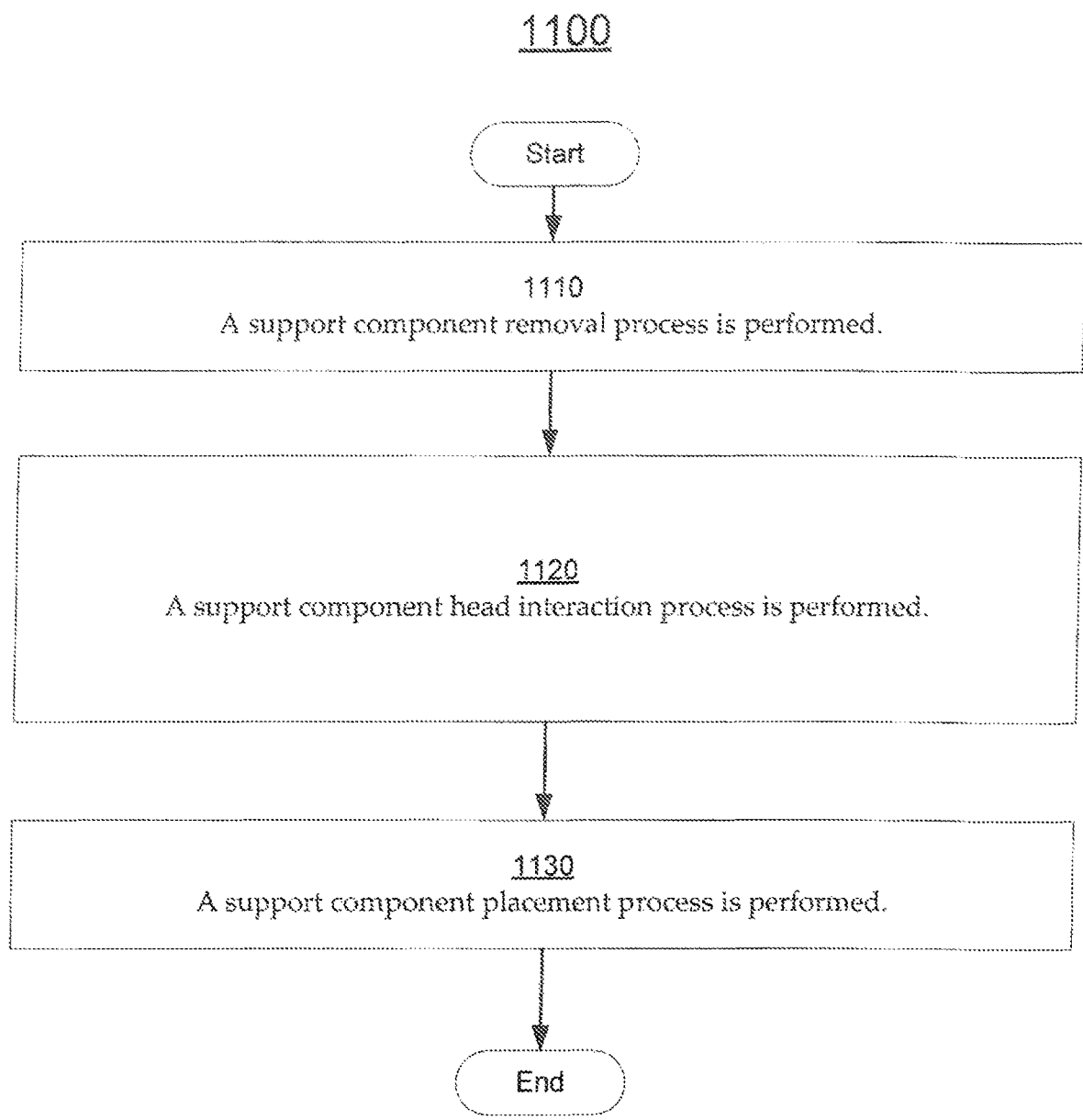
FIG. 11 is a flow chart of an exemplary support component exchange method in accordance with one embodiment.

FIG. 11 is a block diagram of an example support component exchange method 1100 in accordance with one embodiment. Support component exchange method 1100 can be utilized to load/unload a support component (e.g., ATI device, exchange kit, etc.) to/from a test system. In one embodiment, an exchange method (e.g., load, unload, etc.) includes opening an exchange socket latch, engaging a thermal head, pins in exchange socket actuate ATI clamps, and closing the exchange socket latch.

In block 1110, a support component removal process is performed. In one embodiment, a support component is removed from an exchange socket. In one embodiment, a support component provides support for testing related functions that are not necessarily directly involved in test pattern generation and communication. In one embodiment, a support component provides support for controlling a thermal condition (e.g., DUT temperature, environmental temperature, etc.). In one exemplary implementation, a support component includes and ATI. The exchange socket holds the support component while it is inserted/extracted to/from a test system.

In block 1120, a support component head interaction process is performed. In one embodiment, a coupling/ decoupling status of a support component and a support component head is changed. In one exemplary implementation, during a load process the support component is selectively coupled to a support component head and lifted out of an exchange socket. In one exemplary implementation, during an unload process the support component is selectively decoupled from a support component head and placed in and coupled to an exchange socket.

In block 1130, a support component placement process is performed. In one embodiment, a support component is placed in an exchange socket.

Figure 12:
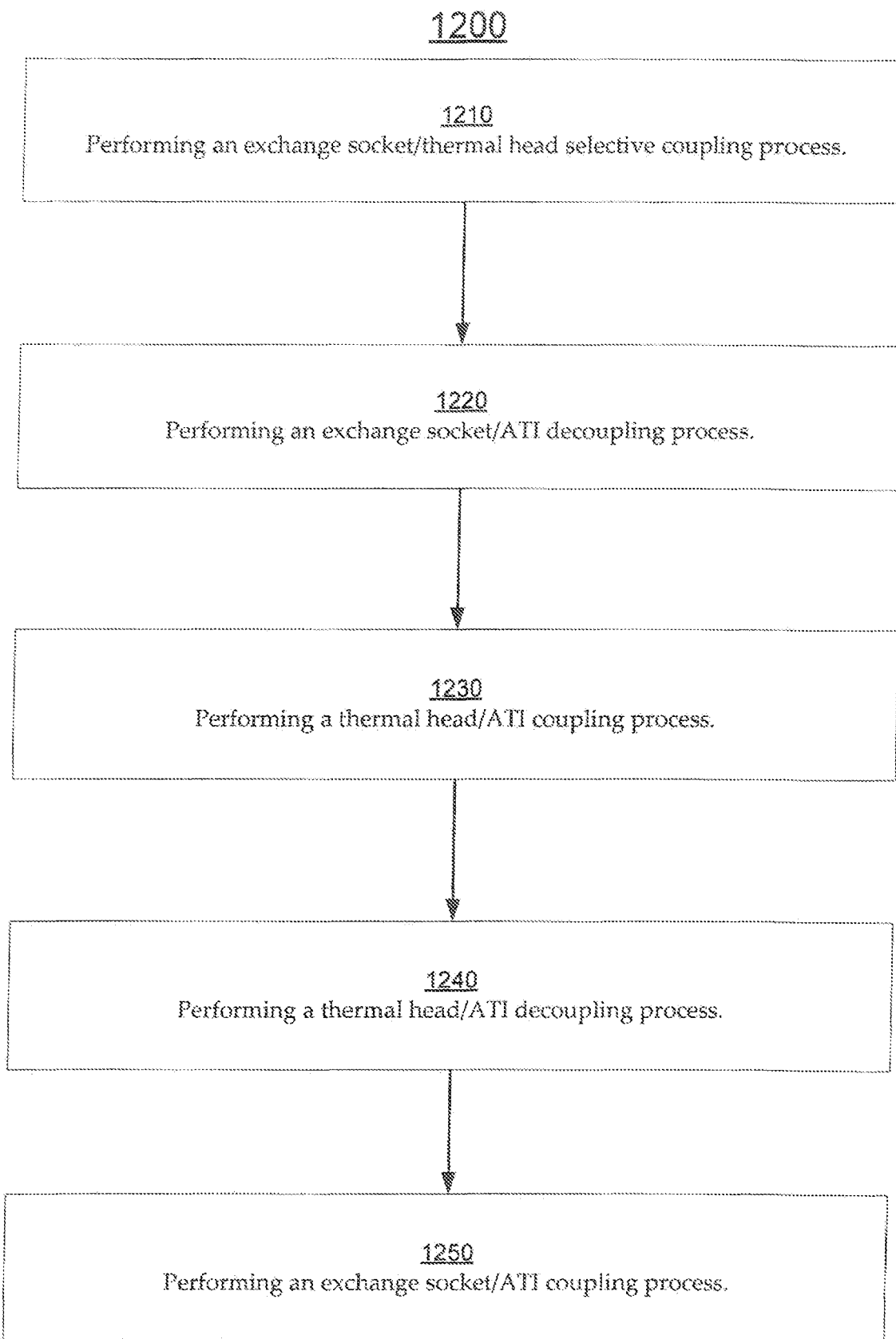
FIG. 12 is a flow chart of an exemplary support component placement process in accordance with one embodiment.

FIG. 12 is a flow chart of an exemplary support component placement process 1200 in accordance with one embodiment. In one embodiment, support component placement process 1200 is similar to support component placement process 1120.

In block 1210, an exchange socket/thermal head selective coupling process is performed. In one embodiment, an exchange socket and thermal head are selectively coupled while an ATI while coupling of an ATI is transitioning from the exchange socket to the thermal head and vice versa. The exchange socket and thermal head are selectively decoupled after an ATI coupling has transitioned from the exchange socket to the thermal head and vice versa.

In block 1220, an exchange socket/ATI release/decoupling process is performed. In one embodiment, an exchange socket disengages an ATI coupling mechanism. In one exemplary implementation, an exchange socket ATI catch is retracted/decoupled from an ATI.

In block 1230, a thermal head/ATI coupling process is performed. In one embodiment, a thermal head engages a thermal head latch mechanism to couple with an ATI. In one exemplary implementation, an exchange socket directs controls the engagement of thermal head latch mechanism. In one exemplary implementation, a thermal head ATI latch release pin included in the exchange socket extends/retracts to control movement of the thermal head latch mechanism.

In block 1240, a thermal head/ATI decoupling process is performed. In one embodiment, a thermal head disengages a thermal head latch mechanism to decouple from an ATI. In one exemplary implementation, an exchange socket directs controls the engagement of thermal head latch mechanism. In one exemplary implementation, a thermal head ATI latch release pin included in the exchange socket extends/retracts to control movement of the thermal head latch mechanism.

In block 1250, an exchange socket/ATI coupling process is performed. In one embodiment, an exchange socket engages an ATI coupling mechanism. In one exemplary implementation, an exchange socket ATI catch is clasps/couples with an ATI.

It is appreciated the components performing blocks 1110 and 1130 can be different. In one embodiment, when loading an ATI device in the test system a pick and place system performs block 1110 placing the ATI device in the exchange socket and a thermal head performs the removal by selectively coupling with the ATI device (e.g., and lifting the ATI device out of the exchange socket, etc.). In one embodiment, when unloading an ATI device in the test system a thermal head performs block 1110 placing the ATI device in the exchange socket and a pick and place system performs the removal of the ATI device and placing the ATI device in an ATI tray. In one embodiment, the placement, interaction, and removal processes are automatic.

In one embodiment, an exchange socket is simpler than a test socket (e.g., the exchange socket does not include electrical connections for conveying test pattern signals, etc.). In one exemplary implementation in which an ATI is exchanged using an exchange socket, a test socket that just holds a DUT and not an ATI device is simpler (e.g., there is no need for an ATI pocket, etc.) than a test socket that holds both a DUT and an ATI device. In one embodiment, a test socket can include latches for the DUT. In one exemplary implementation, latches assist in preventing the DUT from being lifted when the Thermal Head dis-engages.

In one embodiment, a handler would no longer need to remove and replace the ATI device with each DUT insertion (e.g., DUT loading can be faster, the Handler could be less expensive, etc.). In one embodiment, an ATI device can be wired with a connector that only needs to be engaged/disengaged with changes of DUT type (e.g., maybe a few dozen times, etc.) as opposed with a change of each individual DUT (e.g., contacts that need to withstand 10's of thousands of changes, etc.)

Figure 13:
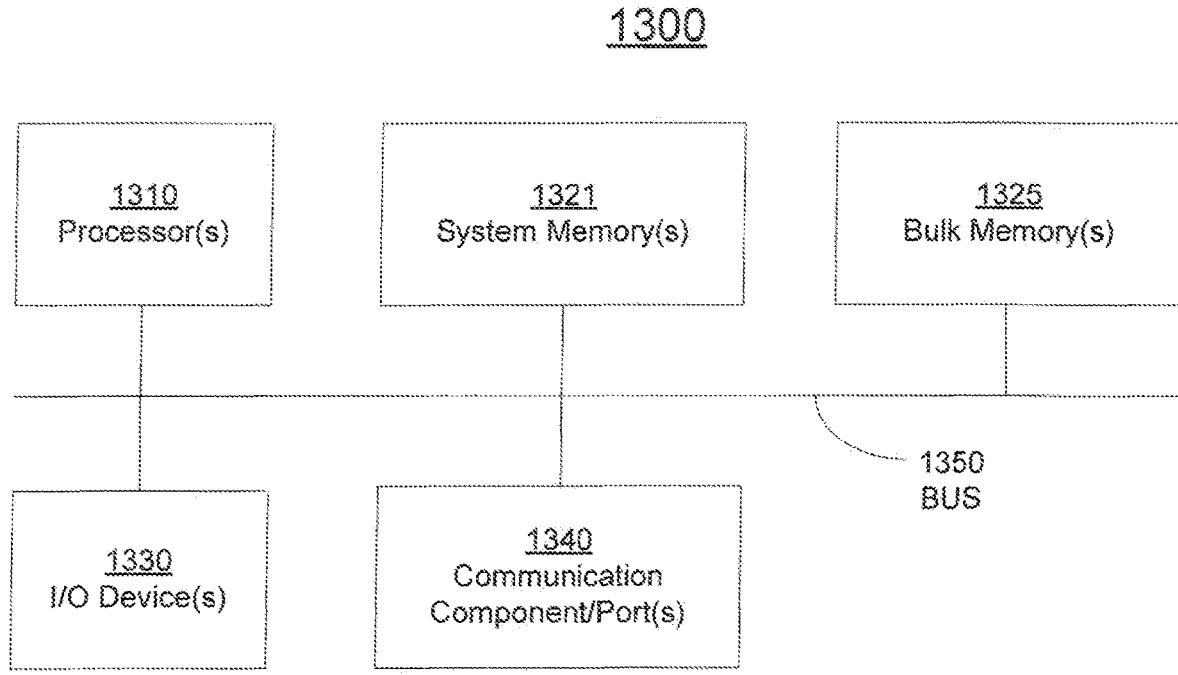
FIG. 13 is a block diagram of an exemplary electronic system which may be used as a platform to implement and control an exchange process in accordance with one embodiment.

FIG. 13 is a block diagram of an exemplary electronic system 1300 which may be used as a platform to implement and control an exchange process in accordance with one embodiment. Electronic system 1300 can be a "server" computer system. Electronic system 1300 includes a central processor(s) 1310, system memory 1315, bulk memory 1325, input/output (I/O) devices 1330, communication component/port 1340, and bus 1350. Bus 1350 is configured to communicatively couple and communicate information between the other components (e.g., central processor(s) 1310, system memory 1315, bulk memory 1325, input/output (I/O) devices 1330, communication component/port 1340, etc.). Central processor(s) 1310 is configured to process information and instructions. System memory 1321 (e.g., reads only memory (ROM), random access memory (RAM), etc.) and bulk memory(s) 1325 is configured to store information and instructions for the central processor complex 1315. I/O device(s) 1330 can communicate information to the system (e.g., central processor 1310, memory 1325, etc.). I/O devices 1330 may be any suitable device for communicating information and/or commands to the electronic system (e.g., a keyboard, buttons, a joystick, a track ball, an audio transducer, a microphone, a touch sensitive digitizer panel, eyeball scanner, display component, light emitting diode (LED) display, plasma display device etc.). Communication port 1340 is configured to exchange/communicate information with external devices/network (not shown). A communication port 1340 can have various configurations (e.g., limitation RS-232 ports, universal asynchronous receiver transmitters (UARTs), USB ports, infrared light transceivers, ethernet ports, IEEE 13394, synchronous ports, etc.) and can communicate with an external network.

Figure 14:
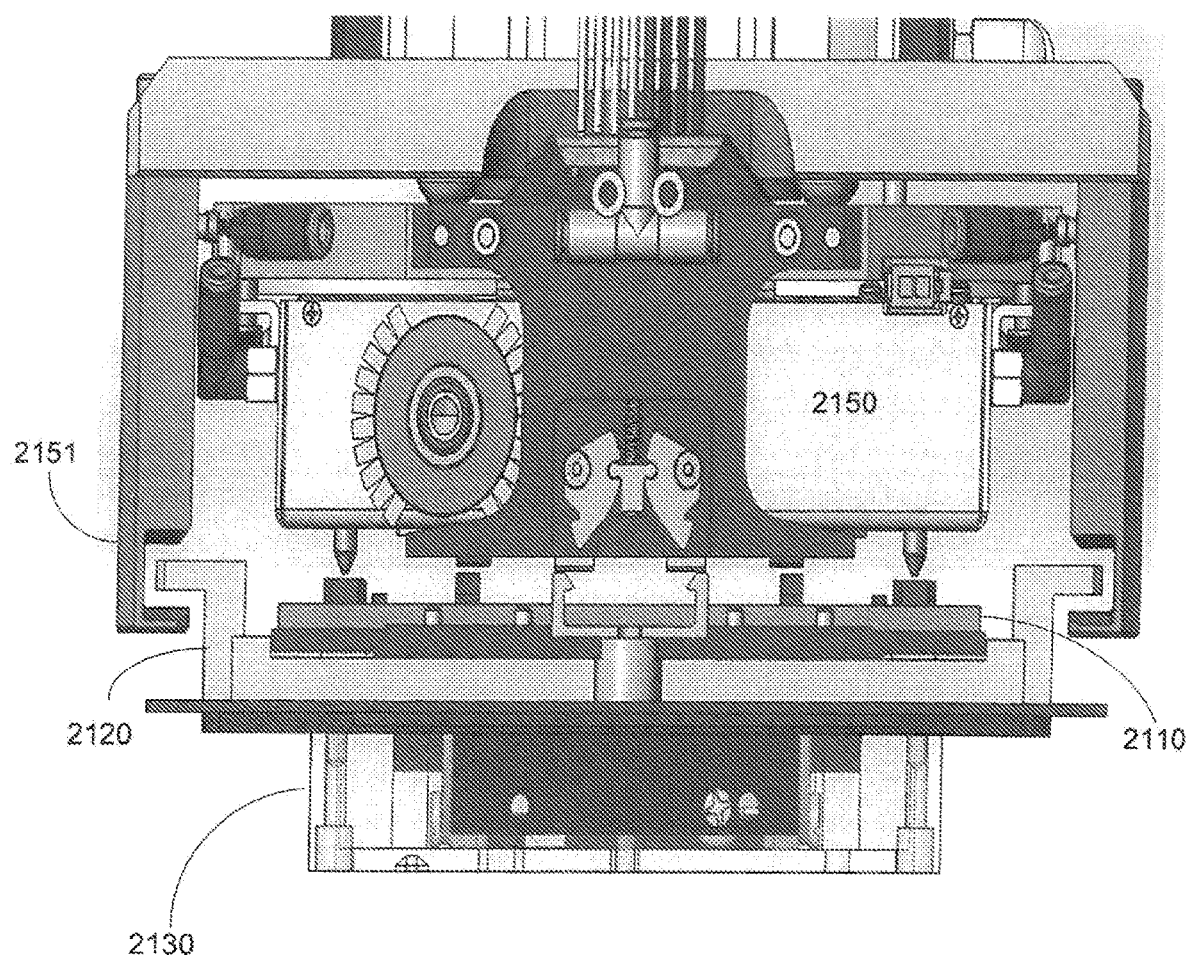
FIG. 14 is a block diagram of an exemplary thermal head, ATI, and exchange socket in accordance with one embodiment.

FIG. 14 is a block diagram of an exemplary thermal head 2150, ATI 2110, and exchange socket 2120 in accordance with one embodiment. The thermal head/array housing 2151 is coupled to the exchange socket 2120 which is coupled to the ATI 2110. ATI 2110 is still recessed in the exchange socket 2120 as shown in FIG. 14. In one embodiment, a portion of exchange socket 2120 includes a portion considered a transition mechanism (e.g., 2130, etc.) for automated ATI installation/swapping.

Figure 15A:
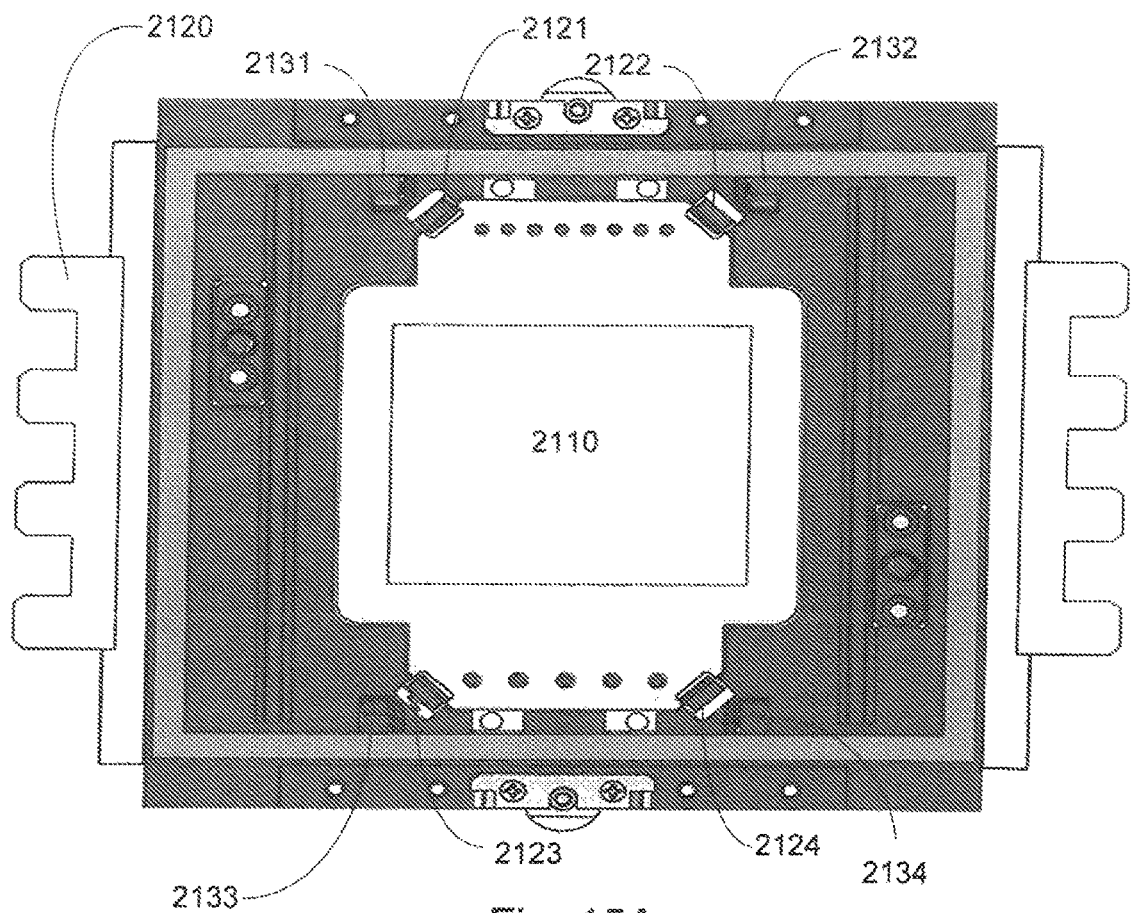
FIG. 15A is a block diagram of an exemplary exchange socket and ATI in a first or initial state of an ATI exchange operation in accordance with one embodiment.
Figure 15B:
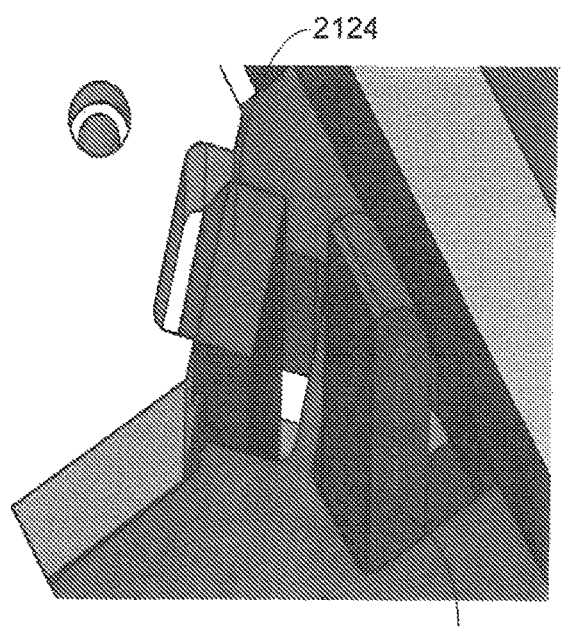
FIG. 15B is an expanded perspective illustration of exchange socket ATI catch and thermal head ATI latch release pin in accordance with one embodiment.
Figure 15C:
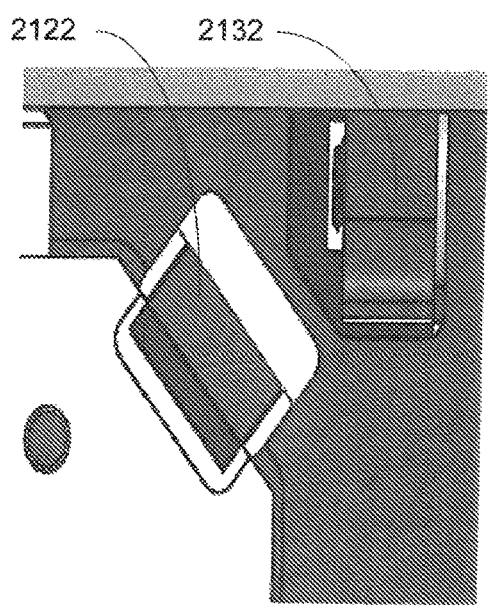
FIG. 15C is an expanded illustration of exchange socket ATI catch and thermal head ATI latch release pin in accordance with one embodiment.

FIG. 15A is a block diagram of an exemplary exchange socket 2120 and ATI 2110 in a first or initial state of an ATI exchange operation in accordance with one embodiment. Exchange socket 2120 includes exchange socket ATI catches (e.g., 2121, 2122, 2123, 2124, etc.) and thermal head ATI latch release pins (e.g., 2131, 2132, 2133, 2134, etc.). In one embodiment, exchange socket ATI catches (e.g., 2121, 2122, 2123, 2134, etc.) and thermal head ATI latch release pins (e.g., 2131, 2132, 2133, 2134, etc.) are considered coupling components/mechanisms of holding interface components (e.g., similar to 129, 171, etc.). FIG. 15B is an expanded perspective illustration of exchange socket ATI catch 2124 and thermal head ATI latch release pin 2134 in accordance with one embodiment. FIG. 15C is an expanded top view illustration of exchange socket ATI catch 2122 and thermal head ATI latch release pin 2132 in accordance with one embodiment.

Figure 16A:
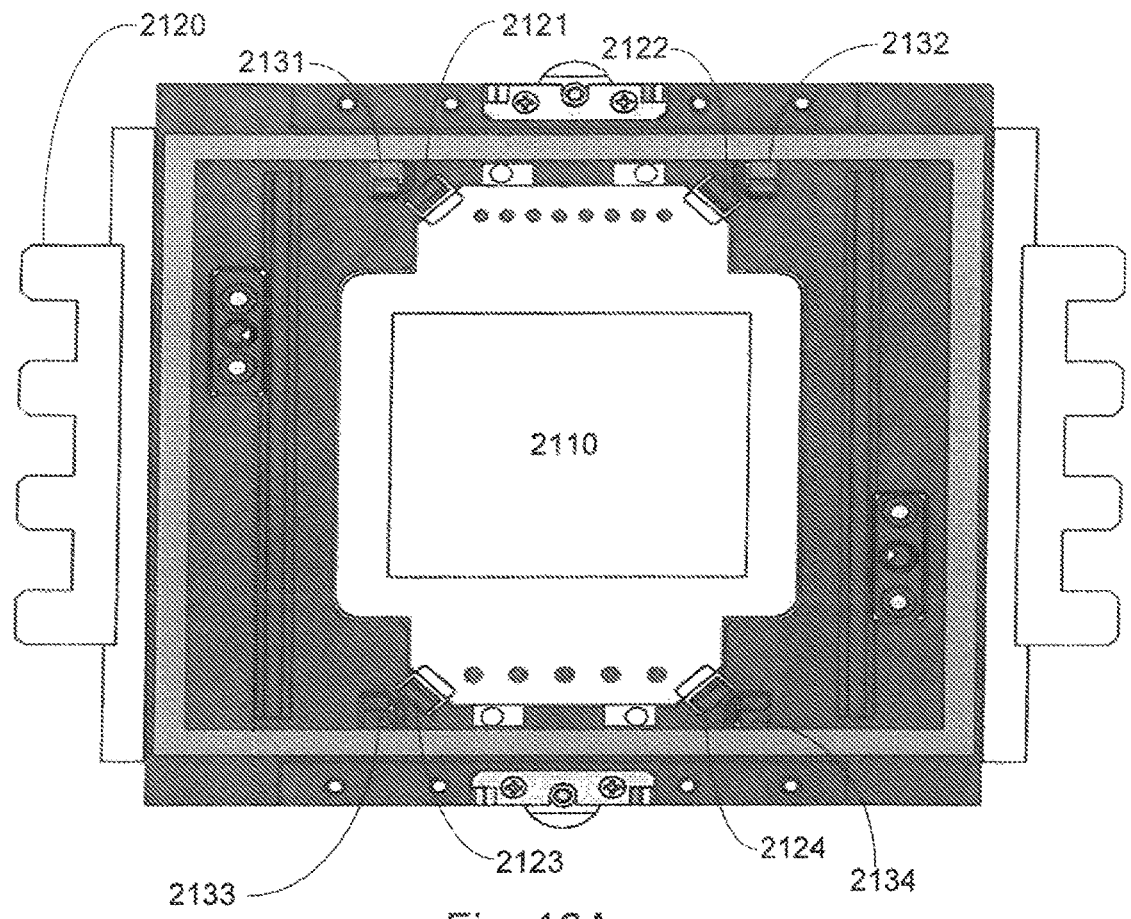
FIG. 16A is a block diagram of an exemplary exchange socket and ATI in an intermediate state of an ATI exchange operation in accordance with one embodiment.
Figure 16B:
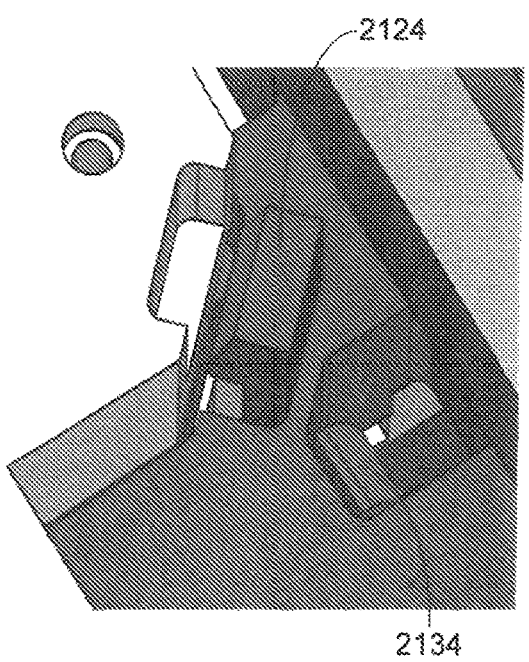
FIG. 16B is an expanded perspective illustration of exchange socket ATI catch releasing the ATI and thermal head ATI latch release pin retracting to allow the cold plate/thermal head (not shown) to latch with the ATI in accordance with one embodiment.
Figure 16C:
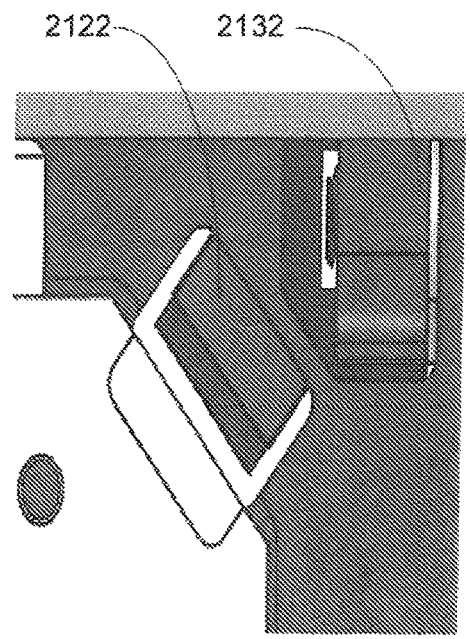
FIG. 16C is an expanded illustration of exchange socket ATI catch in a release position and thermal head ATI latch release pin in a retracted position in accordance with one embodiment.

FIG. 16A is a block diagram of an exemplary exchange socket 2120 and ATI 2110 in an intermediate state of an ATI exchange operation in accordance with one embodiment. In one exemplary implementation the intermediate state is after a thermal head has come in contact with the ATI and the exchange socket and the coupling components/mechanisms of holding interface components being configured to prepare for release of the ATI from the exchange socket and be coupled to the cold plate/thermal head. FIG. 16B is an expanded perspective illustration of exchange socket ATI catch 2124 releasing the ATI 2110 and thermal head ATI latch release pin 2134 retracting to allow the cold plate/thermal head (not shown) to latch with the ATI 2110 in accordance with one embodiment. FIG. 16C is an expanded top view illustration of exchange socket ATI catch 2122 in a release position and thermal head ATI latch release pin 2132 in a retracted position.

Figure 17A:
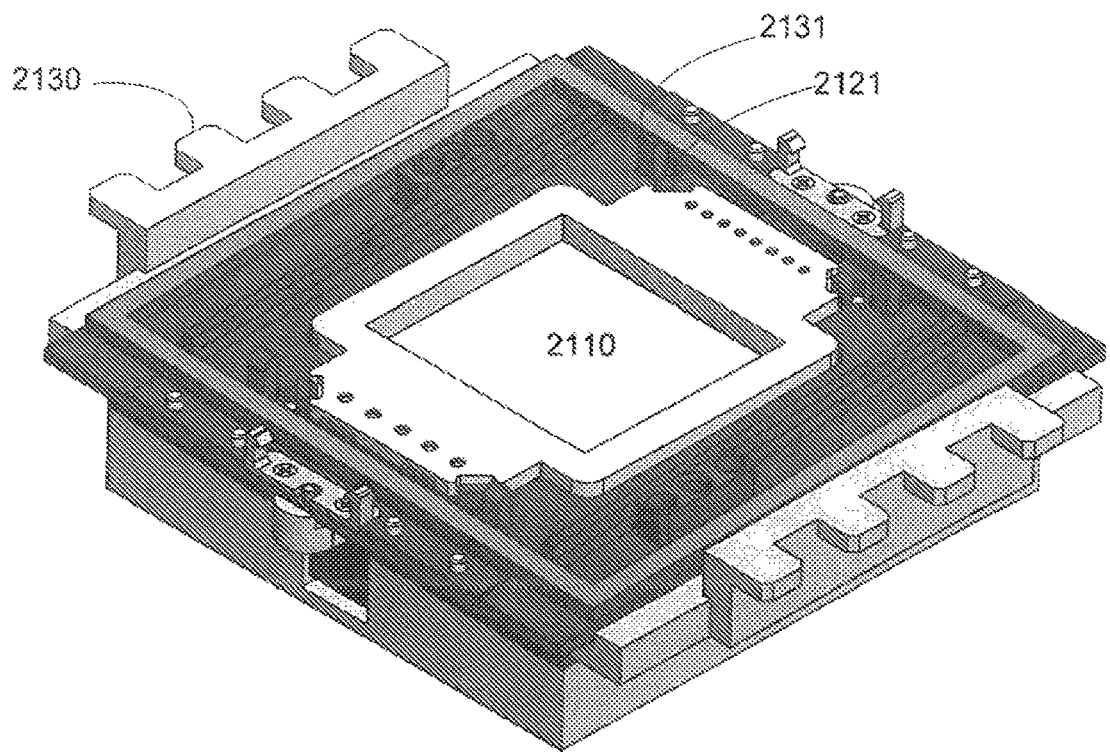
FIG. 17A is a block diagram perspective view of an exemplary exchange socket and ATI in a first or initial state of an ATI exchange operation in accordance with one embodiment.
Figure 17B:
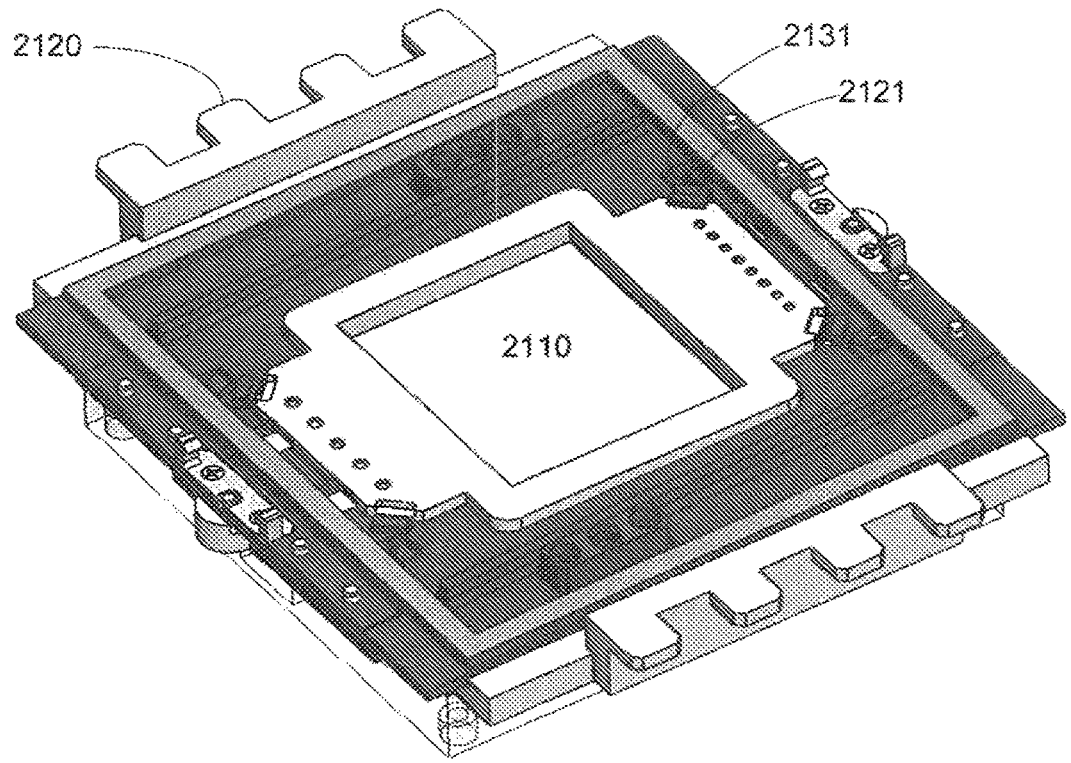
FIG. 17B is a block diagram perspective view of an exemplary exchange socket and ATI in a second state of an ATI exchange operation in accordance with one embodiment.

FIG. 17A is a block diagram perspective view of an exemplary exchange socket 2120 and ATI 2110 in a first or initial state of an ATI exchange operation in accordance with one embodiment. In this embodiment the exchange socket is exchanging multiple components. The exchange socket ATI catches (e.g., 2121, etc.) are coupled to the ATI 2110 and the thermal head ATI latch release pins (e.g., 2131, etc.) are up/extended. FIG. 17B is a block diagram perspective view of an exemplary exchange socket 2120 and ATI 2110 in a second state of an ATI exchange operation in accordance with one embodiment. The exchange socket ATI catches (e.g., 2121, etc.) are not coupled to the ATI 2110 and the thermal head ATI latch release pins (e.g., 2131, etc.) are down/retracted.

Figure 18A:
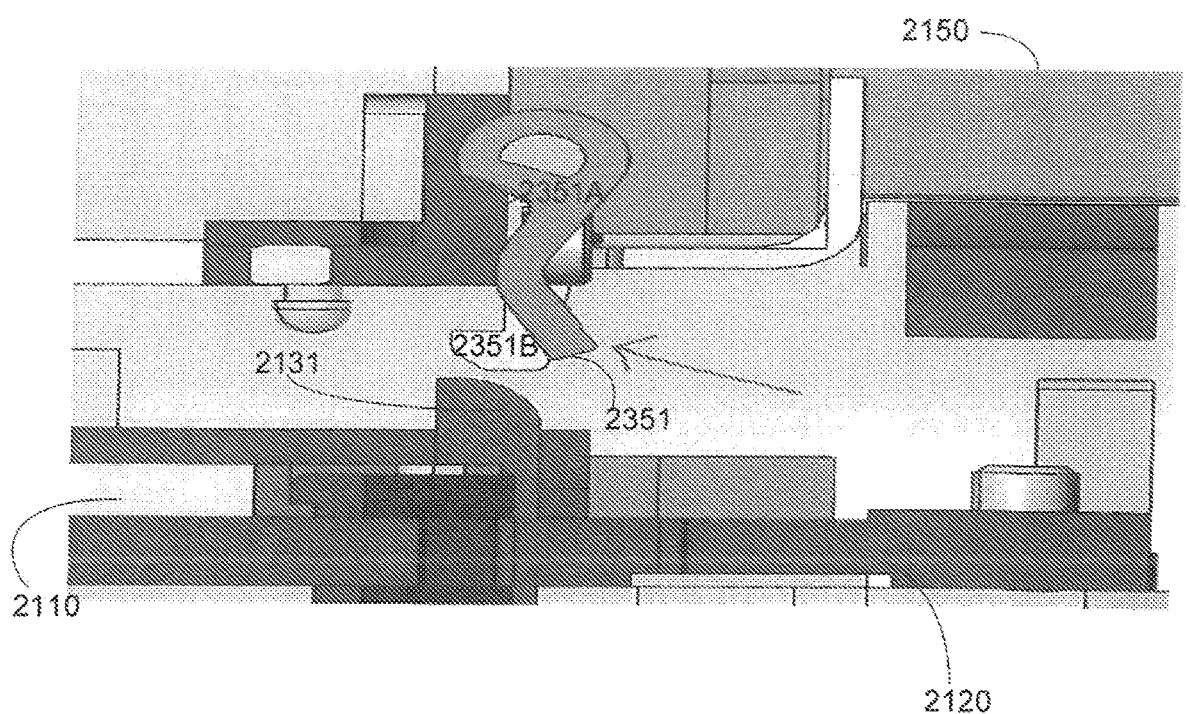
FIG. 18A is a block diagram of an exemplary exchange socket, ATI, and thermal head in a first or initial state in accordance with one embodiment.

FIG. 18A is a block diagram of an exemplary exchange socket 2320, ATI 2110, and thermal head 2150 in a first or initial state in accordance with one embodiment. Thermal head 2150 includes thermal head latch mechanism 2351 (which includes portions 2351A and 2351B). Exchange socket 2320 includes thermal head ATI latch release pin 2131. In one exemplary implementation, exchange socket 2320 and ATI 2110 are in a first/initial state when the ATI 2110 is still coupled to the exchange socket 2320 and before the ATI 2110 is coupled to the thermal head 2150. In one exemplary, implementation thermal head ATI latch release pin 2131 is operable to move and make contact with thermal head latch mechanism 2351 so that thermal head latch mechanism 2351 engages or disengages with ATI 2110. When thermal head latch mechanism 2351 engages with ATI 2110 the thermal head 2150 is coupled to ATI 2110. When thermal head latch mechanism 2351 disengages from ATI 2110, the thermal head 2150 decouples from ATI 2110.

Figure 18B:
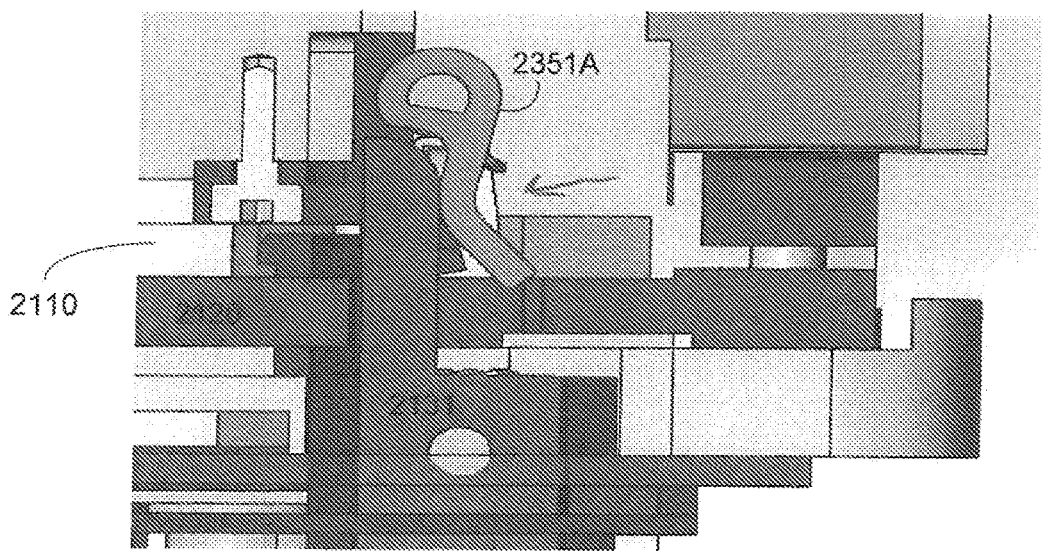
FIG. 18B is a block diagram of an exemplary exchange socket and ATI in a second state in accordance with one embodiment.

FIG. 18B is a block diagram of an exemplary exchange socket 2320 and ATI 2110 in a first state in accordance with one embodiment. In one exemplary, exchange socket 2320 and ATI 2110 are in a first/initial state when the ATI is still coupled to the exchange socket but the thermal head ATI latch release pin 2131 is extended to move the thermal head latch mechanism 2351 by exerting force on portion 2351A.

Figure 18C:
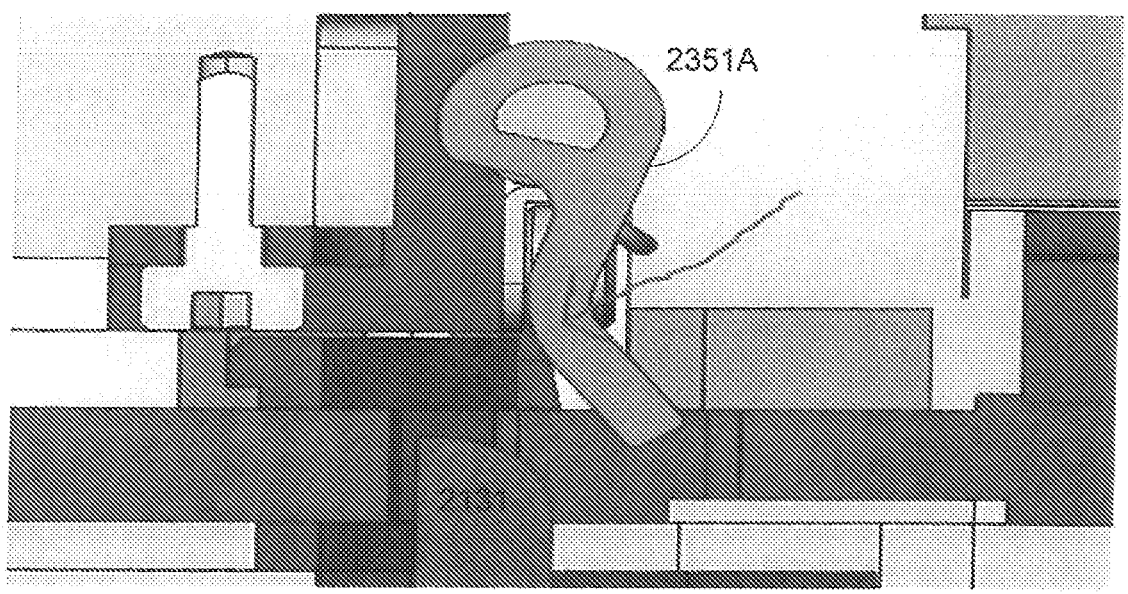
FIGS. 18C and 18D are block diagrams of an exemplary exchange socket and ATI in a third state in accordance with one embodiment.
Figure 18D:
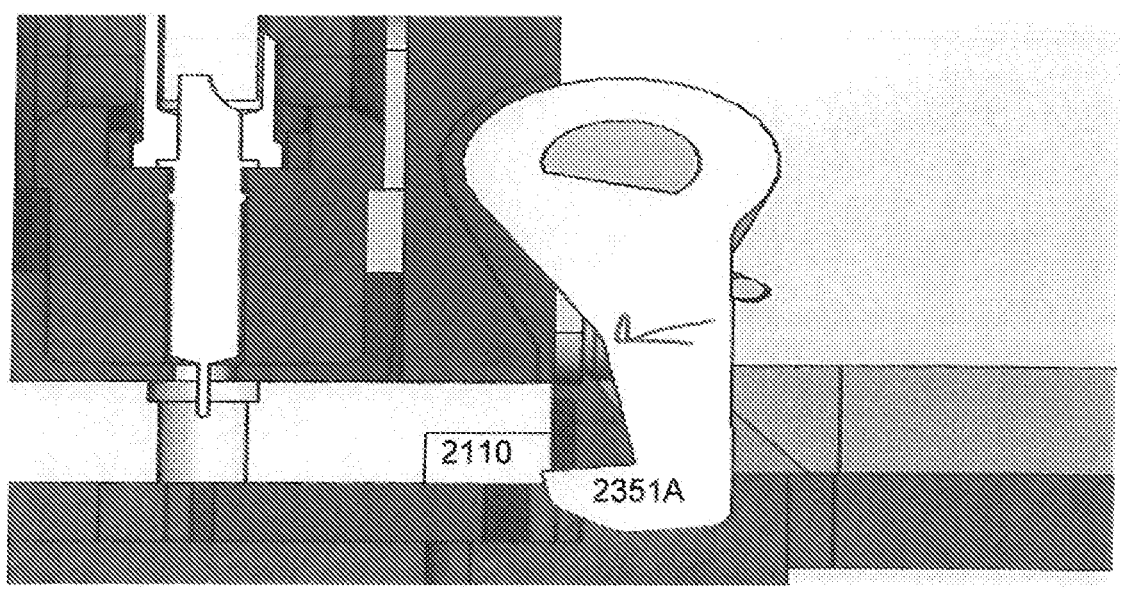

FIGS. 18C and 18D are block diagrams of an exemplary exchange socket 2320 and ATI 2110 in a second state in accordance with one embodiment. In one exemplary, exchange socket 2320 and ATI 2110 are in a second state in which thermal head latch mechanism 2351 is clasping the ATI 2110. In one exemplary implementation, thermal head ATI latch release pin 2131 is retracted from portion 2351A allowing portion 2351B to engage with ATI 2110 and couple the thermal head 2150 to ATI 2110.

Figure 19A:
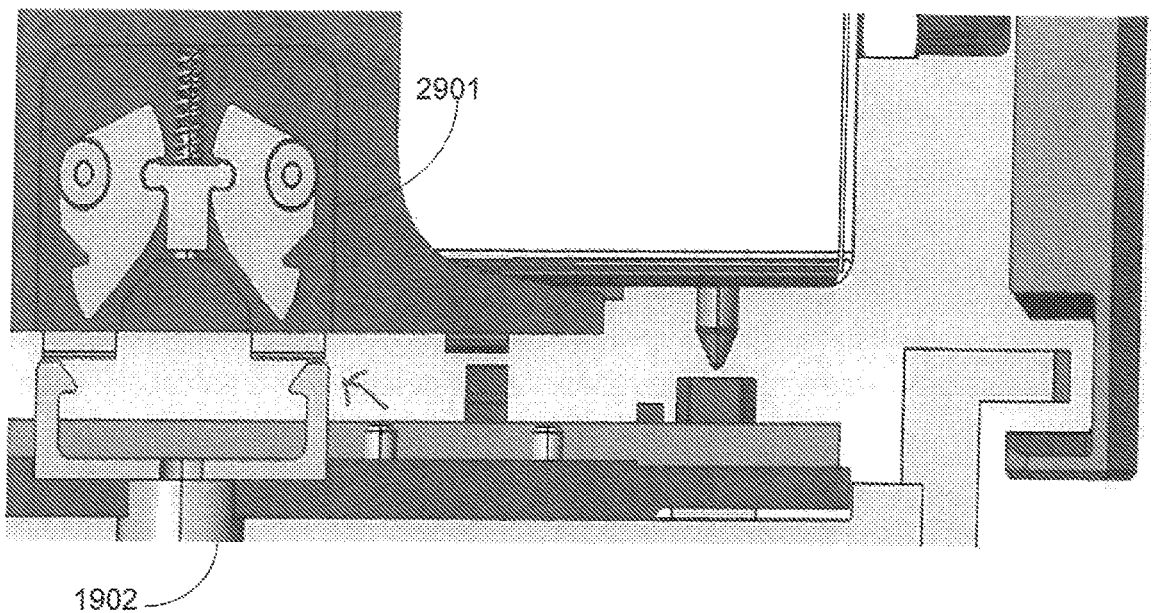
FIGS. 19A and 19B are block diagrams of an exemplary exchange socket/thermal head selective coupling mechanism in accordance with one embodiment.
Figure 19B:
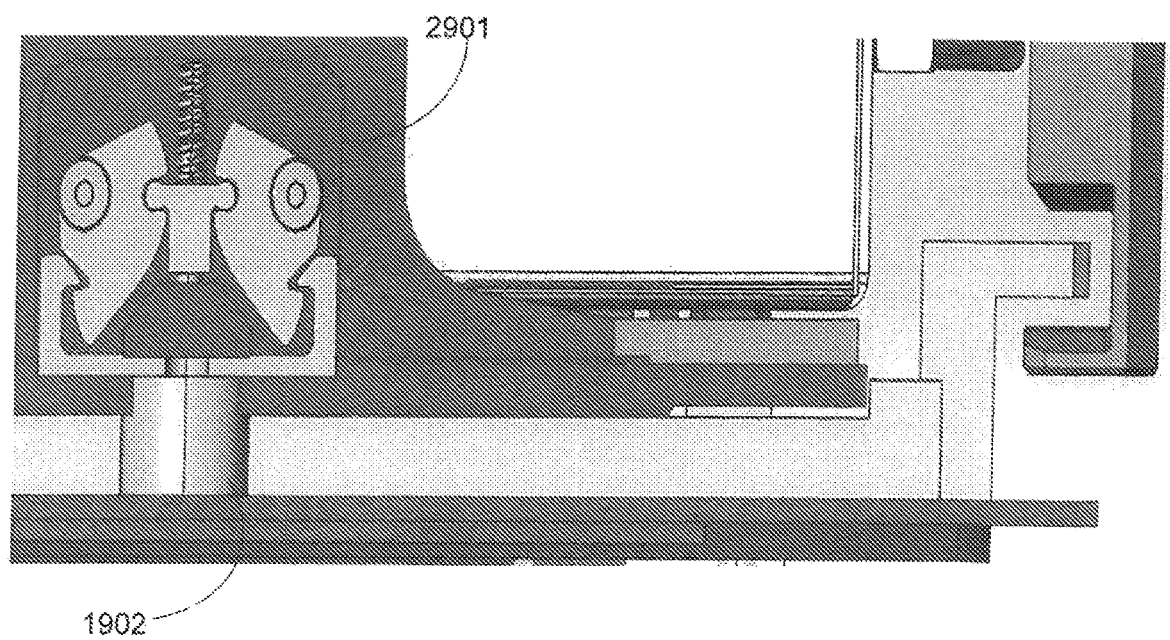

FIGS. 19A and 19B are block diagrams of an exemplary exchange socket/thermal head selective coupling mechanism in accordance with one embodiment. A first portion 2901 of the exchange socket/thermal head selective coupling mechanism is included in a thermal head and as second portion of the exchange socket/thermal head selective coupling mechanism is included in an ATI. FIG. 19A shows the first portion 2901 and second portion 2902 disengaged from one another and FIG. 19B shows the first portion 2901 and second portion 2902 engaged with one another.

Figure 20A:
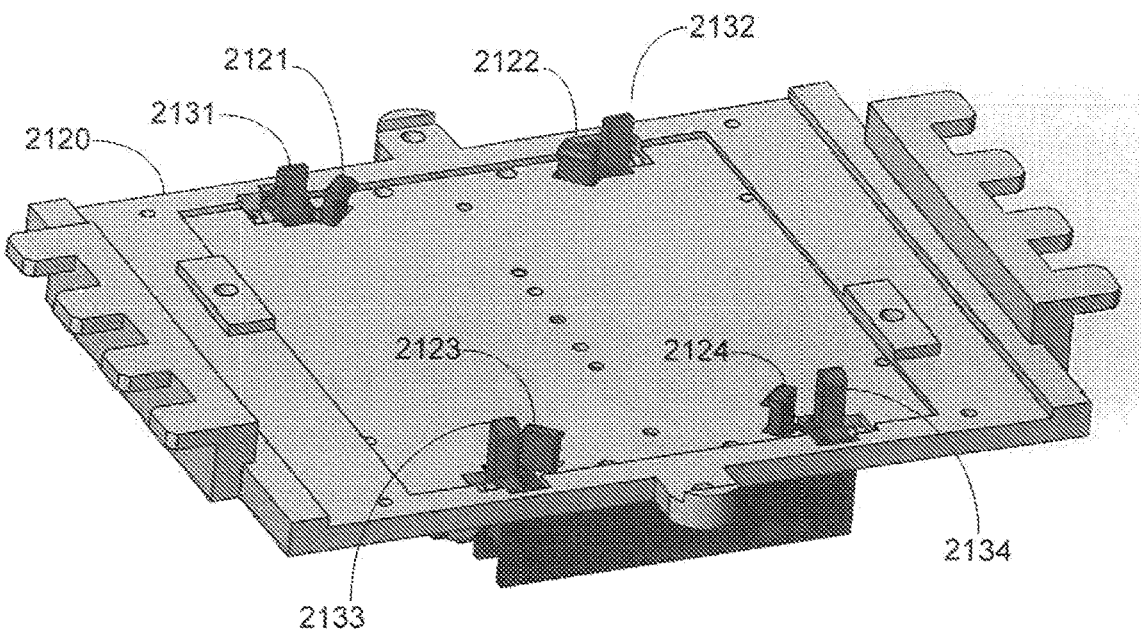
FIG. 20A is a top view of an exemplary exchange socket in accordance with one embodiment.
Figure 20B:
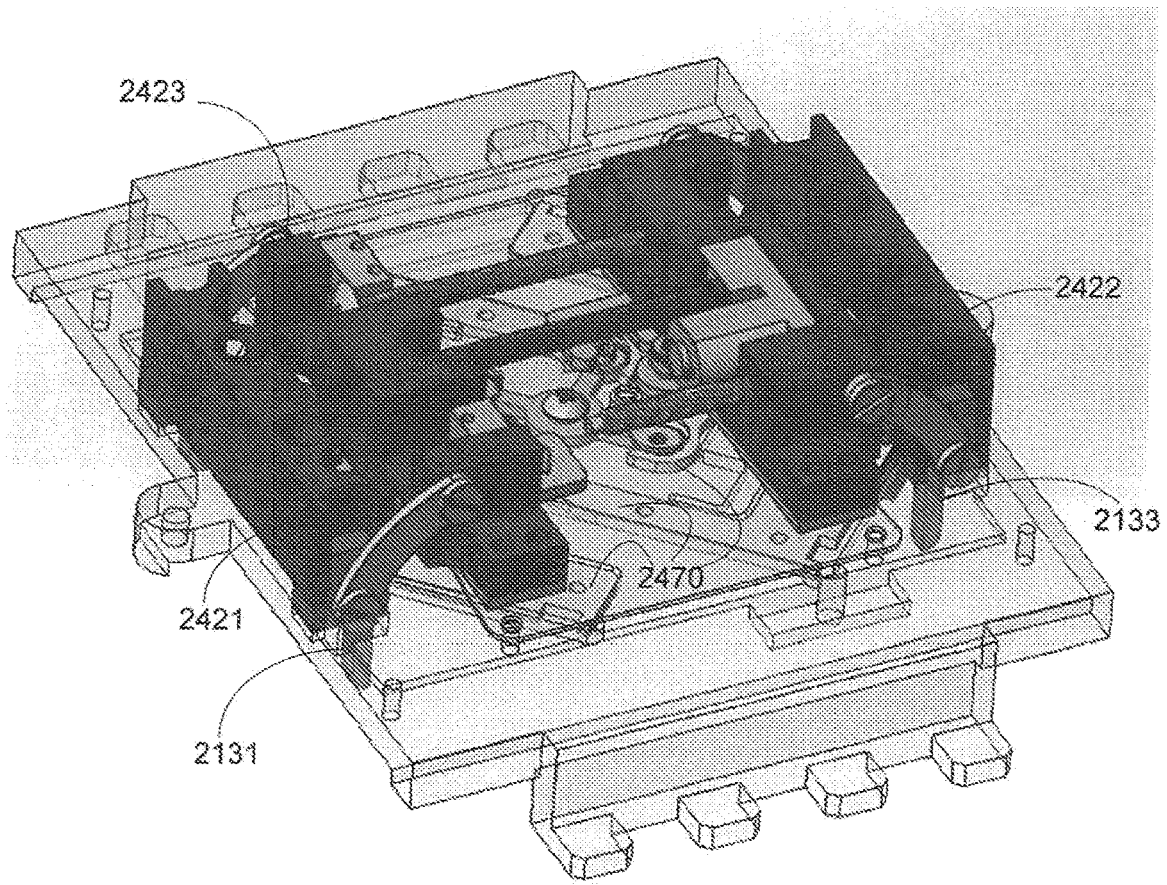
FIG. 20B is a perspective view of exemplary exchange socket in accordance with one embodiment.

FIG. 20A is a top view of an exemplary exchange socket 2120 in accordance with one embodiment. Exchange socket 2120 includes ATI catches 2121, 2123, 2124, and 2122 and thermal head ATI latch release pins 2131, 2133, 2134, and 2132. FIG. 20B is a perspective bottom view of exemplary exchange socket 2120 in accordance with one embodiment. Thermal head ATI latch release pins (e.g., 2131, etc.) ride in a bushing track (e.g., 2421, etc.). Linkages (e.g., 2422, etc.) attach thermal head ATI latch release pins (e.g., 2133, etc.) to moving blocks (e.g., 2423, etc.). Exchange socket 2120 also includes a catch mechanism 2470. In one embodiment, the components described FIG. 20B are considered part of the transition mechanism (e.g., includes bushing track 2421, catch mechanism 2470, etc.) of the exchange socket 2120.

In one embodiment, there is a motion flow or logic for the thermal head ATI latch release pins and catches included in the exchange socket. In one exemplary implementation, a motion flow or logic includes two states. One state is where the ATI is coupled to the exchange socket and another state is where the ATI is coupled to the thermal head. In one embodiment, a floating DC geared motor with a screw and nut spin to actuate the mechanism between the 2 positions. Allowance is made for over travel in slide rails (both pins and catches). In one exemplary implementation, a limit switch stops movement at a desired stopping point and a hard stop is adjusted to allow travel approximately 0.05 mm past the desired stopping point. A current limit stops the motor if it gets jammed or if limit switch fails. In one embodiment, there is a hard stop on catch inner limit to prevent damaging ATI. In a first state the limit switch is open, the ATI catch is closed and the thermal head ATI latch release pin is up/extended. In a second state the limit switch is closed, the ATI catch is open, and the thermal head ATI latch release pin is down/retracted.

Figure 20C:
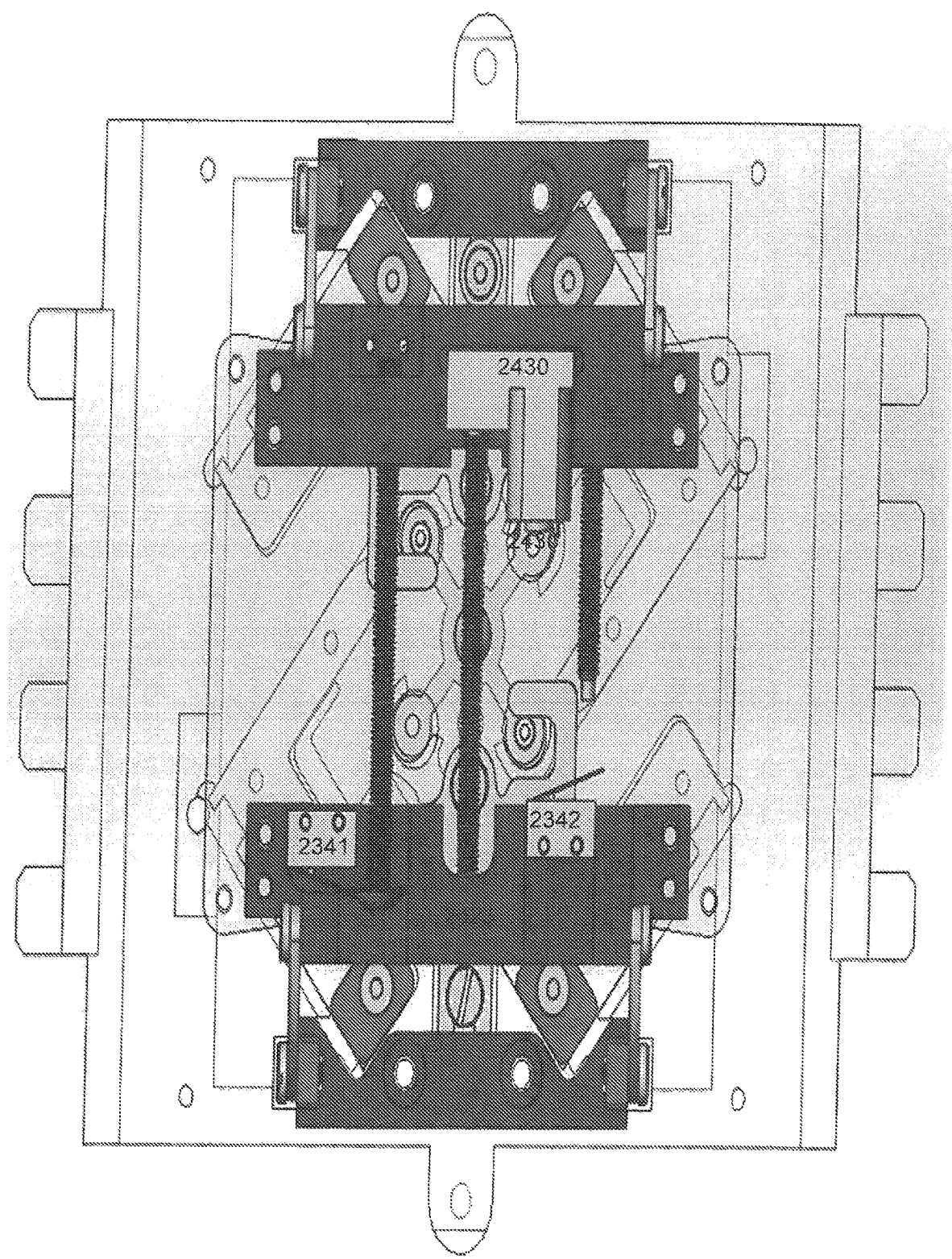
FIG. 20C is a bottom view of an exemplary exchange socket in accordance with one embodiment.

FIG. 20C is a bottom view of an exemplary exchange socket 2120 in accordance with one embodiment. Block motion is controlled by a floating geared DC motor 2430 on tracks with screws. The block 2423 is free to move on tracks until they hit either the inner limit or outer limit travel switches. In one embodiment, a screw head presses outer travel limit switch 2441 and a set screw tip presses inner travel limit switch 2442.

Figure 21A:
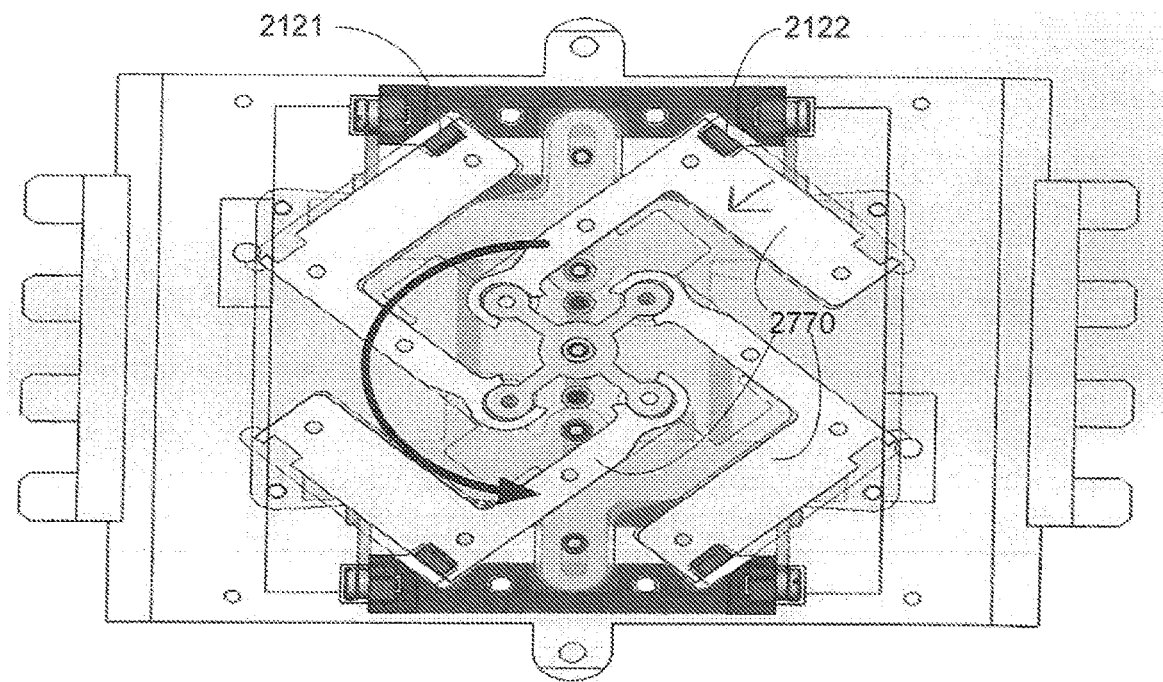
FIGS. 21A and 21B are block diagrams of an exemplary exchange socket ATI catch mechanism in accordance with one embodiment.
Figure 21B:
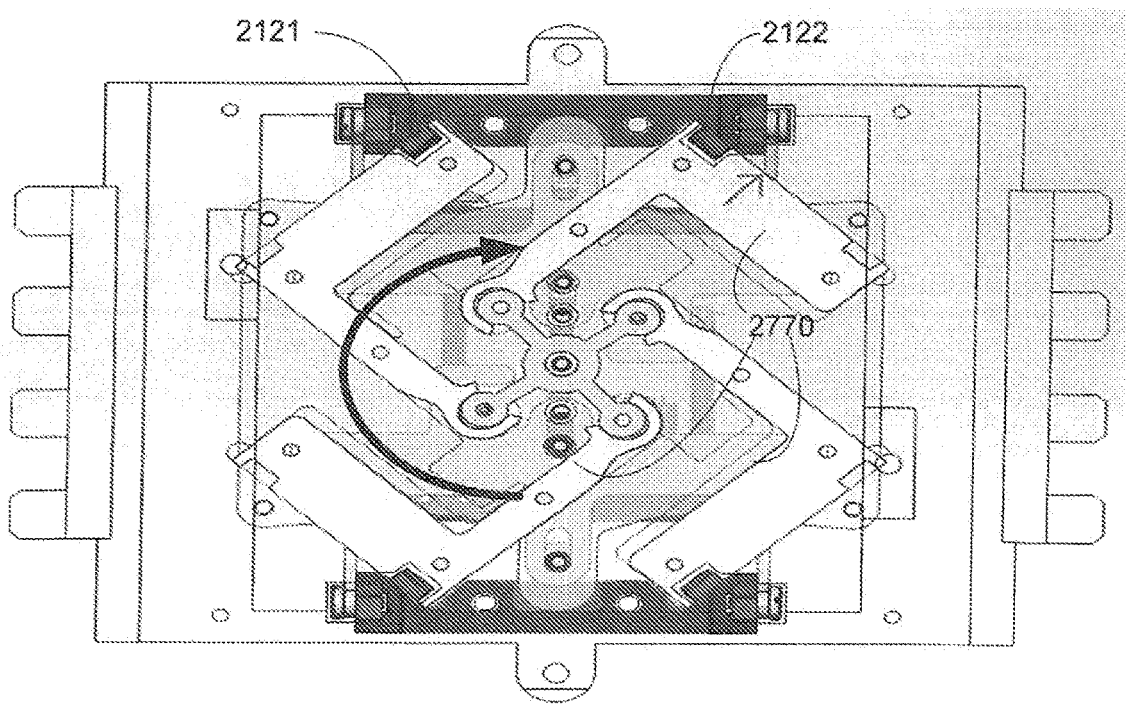

FIGS. 21A and 21B are block diagrams of an exemplary exchange socket ATI catch mechanism in accordance with one embodiment. The exchange socket ATI catches (e.g., 2121, 2122, etc.) are coupled to a cam mechanism 2770. The cam mechanism 2770 rotates in a first direction as shown in FIG. 21A causing the ATI catches (e.g., 2121, 2122, etc.) to move toward the center of the exchange socket which results in the ATI catches engaging/coupling with an ATI (not shown). The cam mechanism 2770 rotates in a second direction as shown in FIG. 21B causing the ATI catches (e.g., 2121, 2122, etc.) to move away from the center of the exchange socket which results in the ATI catches disengaging/decoupling from the ATI (not shown). The cam mechanism is configured to ensure synchronous motion in which the exchange socket ATI catch fully open or fully close together.

Figure 22A:
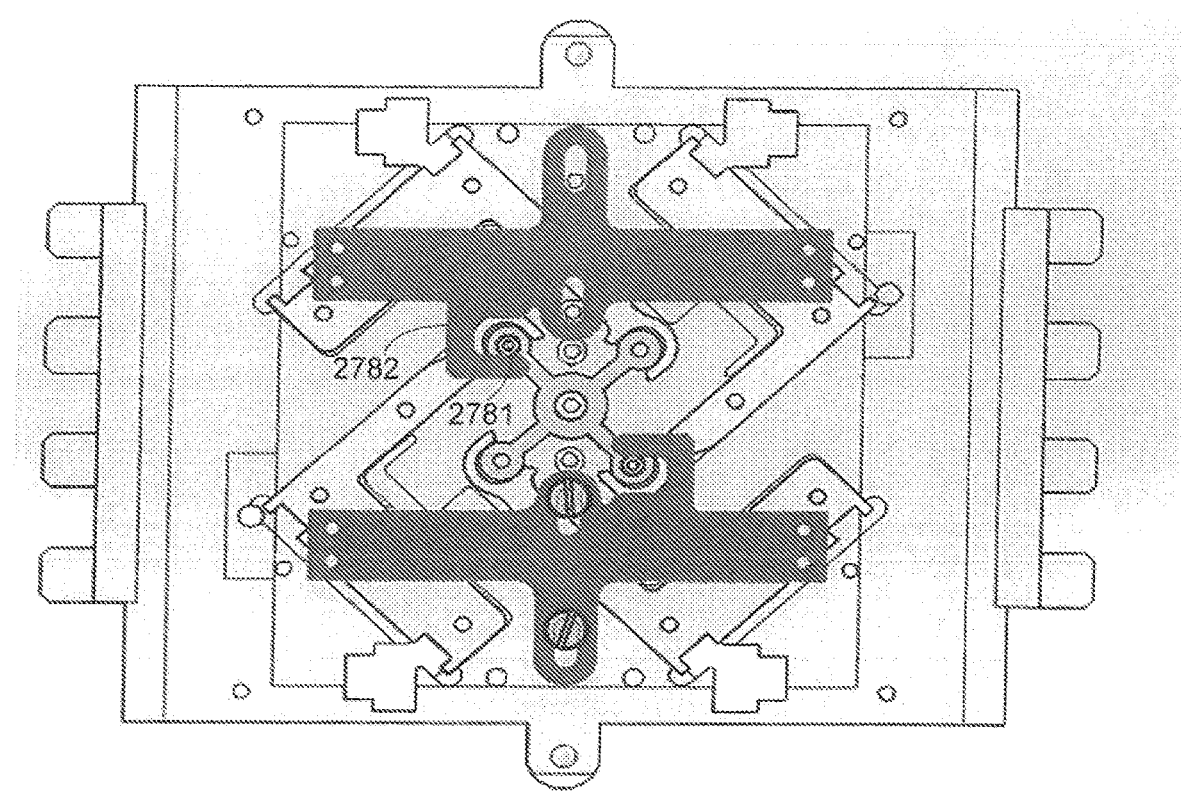
FIGS. 22A, 22B and 22C are block diagrams of an exemplary exchange socket ATI catch mechanism in accordance with one embodiment.
Figure 22B:
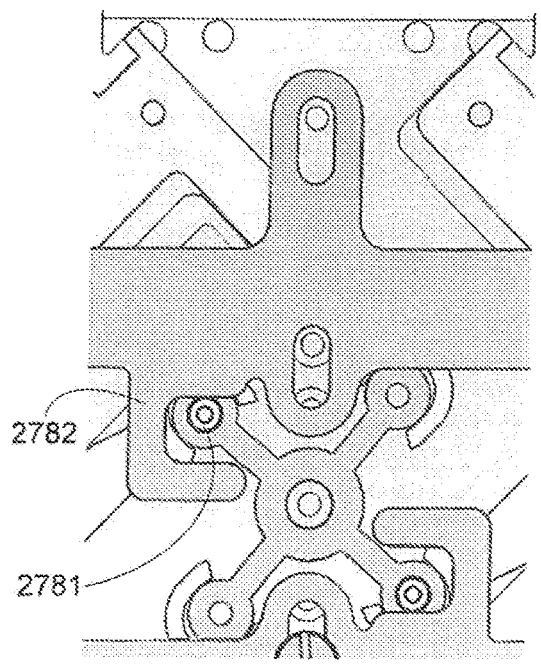
Figure 22C:
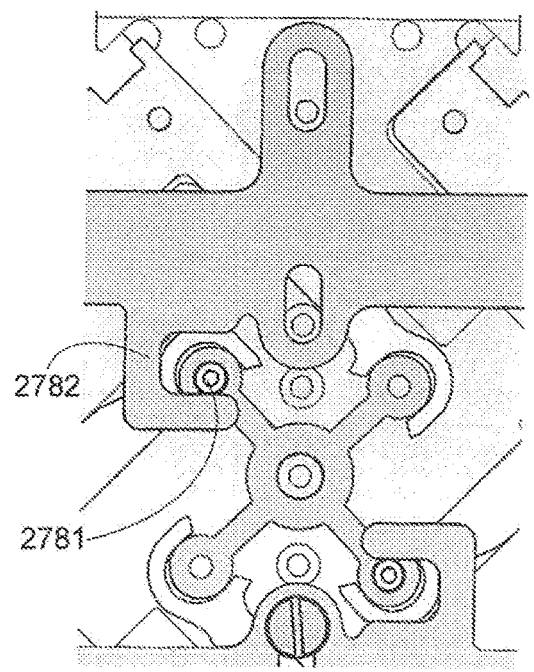

FIGS. 22A, 22B and 22C are block diagrams of an exemplary exchange socket interconnection of a release pin mechanism and an ATI catch mechanism in accordance with one embodiment. Bolt heads 2781 on the catch mechanism are pushed by a plate 2782 on the release pin mechanism. In one embodiment, the thermal head ATI latch release pins need to move nearly 7 mm which the catches move 2 mm. As shown in FIGS. 22B and 22C when the release pin mechanism moves to its outer limits, the catch mechanism is also pushed to its closed position (and vice versa).

In one embodiment, a plurality of support component exchange sockets are included in an exchange bib. In one exemplary implementation, an exchange bib is temporarily inserted in a thermal array while the ATIs are transferred/exchanged between the exchange sockets and thermal heads.

In one embodiment, systems and methods provide for exchange of ATI devices. In one exemplary implementation, an ATI is operable to control different portions of a device under test to different temperatures. An ATI device can be compatible and complementary with existing systems and methods of testing integrated circuits. In one embodiment, a thermal stack-up is still optimized. In one exemplary implementation, an ATI device is customized per a DUT. A presented exchange system a method can effectively and efficiently reduce the number of times a support component (e.g., ATI device, exchange kit, etc.) is loaded/unloaded in a test system, which in turn can improve overall test times. The reduction in the number of loading and unloading can reduce the number of times electrical contacts between an ATI device and a thermal head are engaged/dis-engaged (which in turn can allow for utilization of different types of electrical contacts, such as expansion pins and receptacles, etc.).

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

The invention claimed is:

1. An automated test equipment (ATE) system comprising:
   a support component configured to enable support functions associated with testing of a device under test (DUT);
   a support component head configured to selectively couple with the support component; and
   an exchange socket configured to hold the support component for selectively coupling and decoupling the support component and the support component head.

2. The automated test equipment (ATE) system of claim 1 wherein the support component is configured to provide support for testing related functions that are not necessarily directly involved in test pattern generation and communication.

3. The automated test equipment (ATE) system of claim 1 wherein the support component is coupled to the support component head through insertions and extractions of multiple DUTs to and from an ATE system.

4. The automated test equipment (ATE) system of claim 1 wherein the support component is replaced with another support component when a different type of DUT is inserted into the ATE system.

5. The automated test equipment (ATE) system of claim 1 wherein the support component is an Active Thermal Interposer (ATI) device configured to provide support for controlling a thermal condition of the DUT and the support component head is a thermal head.

6. The automated test equipment (ATE) system of claim 1 wherein the exchange socket holds the support component during insertion to and extraction from a test system.

7. The automated test equipment (ATE) system of claim 1 wherein the exchange socket includes transition mechanisms to control coupling and decoupling of the support component to and from the support component head.

8. The automated test equipment (ATE) system of claim 1 wherein:
   the support component is one of a plurality of support components configured to enable support functions associated with testing of a plurality of devices under test (DUTs); and
   the support component head is further configured to selectively couple with the plurality of support components.

9. The automated test equipment (ATE) system of claim 8 wherein one of the plurality of support components corresponding to a second type of one of the plurality of DUTs is removed from the exchange socket and one of the plurality of support components corresponding to a first type of one of the plurality of DUTs is placed in the exchange socket.

10. The automated test equipment (ATE) system of claim 8 wherein one of the plurality of support components includes an Active Thermal Interposer (ATI) device and selectively coupling the ATI device to a test head includes electrically coupling the ATI device to the test head via electrical contacts.

11. The automated test equipment (ATE) system of claim 8 wherein a type of electrical contact between the support component and the support component head is selected based upon various characteristics.

12. The automated test equipment (ATE) system of claim 8 wherein current and signals pass from the support component to the support component head via multi-point expansion pins and receptacles.

13. The automated test equipment (ATE) system of claim 8 wherein the exchange socket is automatically placed in and removed from a bib that is automatically inserted to and extracted from the ATE system.

\* \* \* \* \*